US012749797B2

(12) United States Patent
Yu et al.

(10) Patent No.: US 12,749,797 B2
(45) Date of Patent: Sep. 29, 2026

(54) RADIO FREQUENCY SWITCH

(71) Applicant: Intel Corporation, Santa Clara, CA (US)

(72) Inventors: Chuanzhao Yu, Phoenix, AZ (US); Hyun Yoon, Gilbert, AZ (US); Muhammed Elgousi, Chandler, AZ (US); Xi Li, Chandler, AZ (US); LiChung Tony Chang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 513 days.

(21) Appl. No.: 17/552,619

(22) Filed: Dec. 16, 2021

(65) Prior Publication Data

US 2023/0198124 A1 Jun. 22, 2023

(51) Int. Cl.
*H03H 11/04* (2006.01)
*H01Q 1/22* (2006.01)
*H03K 17/687* (2006.01)

(52) U.S. Cl.
CPC ........... *H01Q 1/2283* (2013.01); *H03H 11/04* (2013.01); *H03K 17/687* (2013.01)

(58) Field of Classification Search
CPC .... H01Q 1/2283; H03H 11/04; H03K 17/687; H03K 2217/0018; H03K 2217/0054; H03K 17/102; H03K 17/693; H03K 17/161; H03K 17/122; H03K 17/6871; H03K 17/164; H03K 17/162; H03K 17/063; H03K 17/0822; H03K 5/22; H03K 17/06; H03K 2017/066; H03K 2217/0027; H03K 2217/0081; H03K 17/18; H03K 19/018521; H03K 19/096; H03K 2217/0036; H03K 5/2481; H03K 17/04123; H03K 17/08104; H03K 17/08142; H03K 17/6872; H03K 17/6874; H03K 19/20; H03K 3/011; H03K 17/04106; H03K 17/08; H03K 17/567; H03K 19/0005; H03K 3/012; H03K 17/0814; H03K 17/165; H03K 17/223; H03K 17/60; H03K 19/0013; H03K 19/003; H03K 19/017509; H03K 2217/0009; H03K 3/354; H03K 17/04; H03K 17/04206;

(Continued)

(56) References Cited

U.S. PATENT DOCUMENTS 7,928,794 B2 * 4/2011 Balboni ........... H03K 17/04106 327/434
9,160,328 B2 * 10/2015 Altunkilic ............ H10D 84/038

(Continued)

*Primary Examiner* — John W Poos

(74) *Attorney, Agent, or Firm* — Schwegman Lundberg & Woessner, P.A.

(57) ABSTRACT

A wireless communication device can include switch circuitry. The switch circuitry can include stacks having a common gate node and a common body node, wherein a stack includes a metal-oxide-semiconductor field-effect transistor (MOSFET) having a body resistive element coupled to a body terminal of the MOSFET and the common body node a gate resistive element coupled to a gate terminal of the MOSFET and the common gate node. The switch circuitry can further include a self-biased MOSFET coupled to the common gate node and the common body node, a gate of the self-biased MOSFET configured to receive direct current (DC) bias with a low pass filter.

12 Claims, 23 Drawing Sheets

(58) Field of Classification Search
CPC ........ H03K 17/16; H03K 17/24; H03K 17/56; H03K 19/0016; H03K 19/00361; H03K 19/00384; H03K 19/091; H03K 2017/6875; H03K 3/0231; H03K 5/1252; H03K 5/153; H03K 5/19; H03K 5/2472; H03K 17/005; H03K 17/0406; H03K 17/145; H03K 17/689; H03K 19/0027; H03K 19/017; H03K 19/018507; H03K 19/0944; H03K 19/09441; H03K 19/0948; H03K 19/0966; H03K 19/1737; H03K 19/17736; H03K 19/1776; H03K 19/17772; H03K 19/1778; H03K 19/17784; H03K 2005/00013; H03K 5/01; H03K 5/135; H03K 5/24; H03K 5/249; H03K 17/04213; H03K 17/302; H03K 17/51; H03K 17/602; H03K 17/74; H03K 17/785; H03K 17/96; H03K 19/00315; H03K 19/00338; H03K 19/013; H03K 19/01707; H03K 19/01714; H03K 19/017545; H03K 19/0185; H03K 19/018557; H03K 19/018578; H03K 2017/515; H03K 23/002; H03K 3/356017; H03K 3/356113; H03K 5/023; H03K 5/12; H04B 1/44; H04B 1/38; H04B 1/40; H04B 1/48; H04B 2001/485; H04B 1/3827; H04B 2001/0408; H04B 1/1615; H04B 1/202; H04B 3/02; H04B 15/04; H04B 7/0482; H04B 7/0639; H04B 7/10; H02H 9/046; H02H 9/02; H02H 9/04; H02H 9/025; H02H 9/041; H02H 9/042; H02H 3/20; H02H 7/205
See application file for complete search history.

(56) References Cited

U.S. PATENT DOCUMENTS

| | | | | |
|---|---|---|---|---|
| 9,628,075 | B2 * | 4/2017 | Cebi .................... | H10D 86/201 |
| 2017/0237432 | A1 * | 8/2017 | Roy ..................... | H03K 17/693<br>326/30 |
| 2018/0091136 | A1 * | 3/2018 | Wang ................... | H10D 86/201 |

* cited by examiner

RADIO FREQUENCY SWITCH

TECHNICAL FIELD

Aspects of the disclosure pertain to radio frequency (RF) communications. More particularly, aspects relate to switches for use in RF circuits.

BACKGROUND

Stacked antenna RF switches can provide improved linearity and low insertion loss benefits, as well as being capable of handling high power. However, the circuitry to control stacked antenna RF switches can be very complex and take up valuable real estate on a chip. There is a general need for less complex control circuitry for antenna RF switches.

BRIEF DESCRIPTION OF THE DRAWINGS

In the drawings, which are not necessarily drawn to scale, like numerals may describe similar components in different views. Like numerals having different letter suffixes may represent different instances of similar components. Some aspects are illustrated by way of example, and not limitation, in the figures of the accompanying drawings in which.

DETAILED DESCRIPTION

The following description and the drawings sufficiently illustrate specific aspects to enable those skilled in the art to practice them. Other aspects may incorporate structural, logical, electrical, process, and other changes. Portions and features of some aspects may be included in, or substituted for, those of other aspects. Aspects set forth in the claims encompass all available equivalents of those claims.

Stacked antenna RF switches can provide improved linearity, can handle high power, and provide low insertion loss benefits. However, some stacked antenna RF switches in available systems use separate logic to control gate and body bias to turn the switches on and off. These control systems can be relatively complex, as well as taking up valuable real estate on silicon.

To address these and other concerns, in aspects, the disclosure provides a self-biased N-type metal-oxide-semiconductor (NMOS) coupled to the gate bias and body bias to provide controls for the ON/OFF states of a stacked antenna RF switch. In the "ON" state, the switch is turned off with the positive bias of the switch NMOS gate. The NMOS body can be in a floating connection configuration, which improves the conductivity of the switch and reduces the insertion loss. In "OFF" state, the switch is turned on with the negative bias of both the body and gate of the NMOS to negative potential. The isolation of the switch is maintained. Electrostatic discharge (ESD) isolation and protection can be maintained by not connecting the NMOS to any of the die bumps of the relevant integrated circuit (IC) package.

Figure 1:
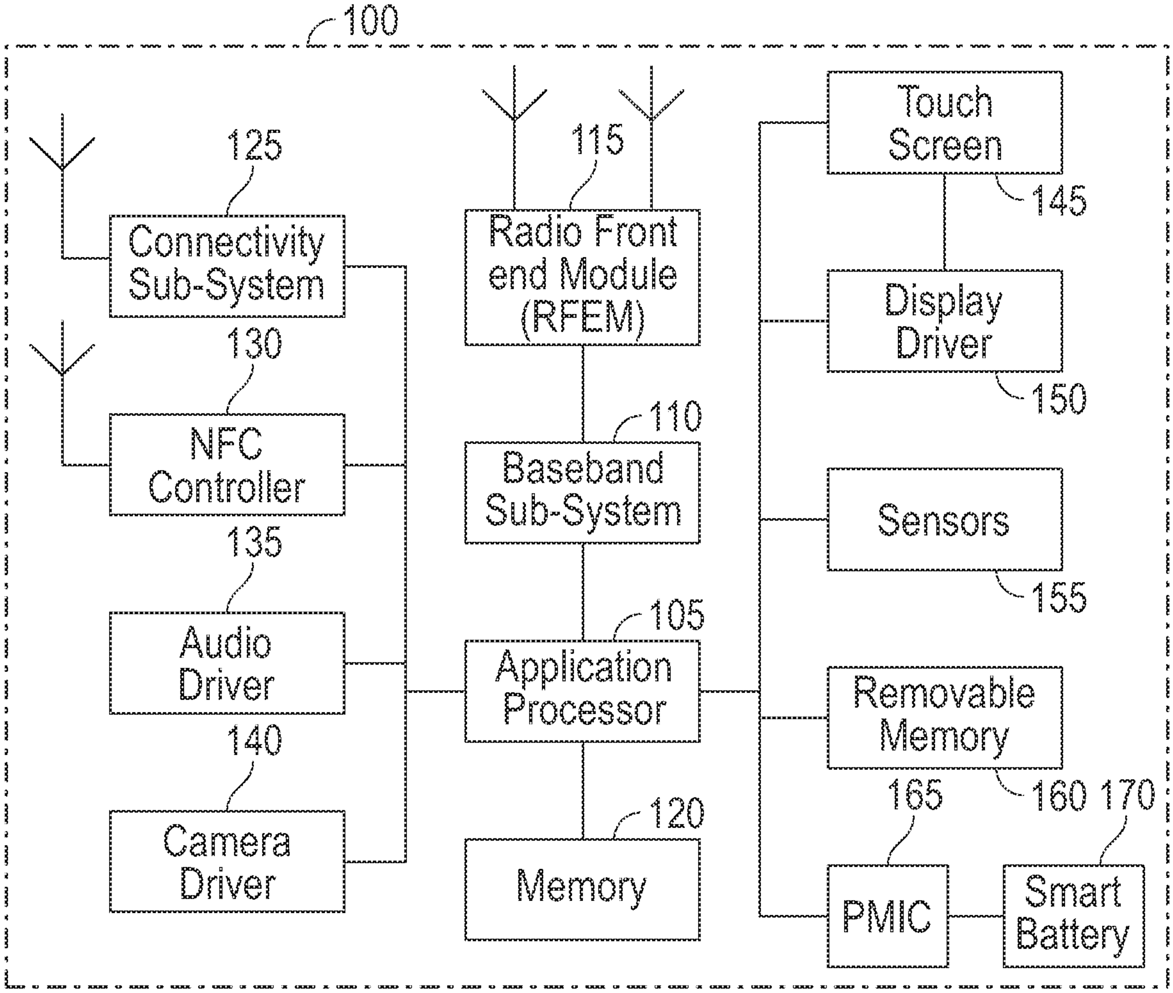
FIG. 1 illustrates an exemplary user device according to some aspects.

An integrated Radio-Frequency frontend module (FEM) is broadly used in the frontend circuits for cellular handsets or other wireless devices. FIG. 1 illustrates an exemplary user device according to some aspects. The user device 100 may be a mobile device in some aspects and includes an application processor 105, baseband processor 110 (also referred to as a baseband sub-system), radio front end module (RFEM) 115, memory 120, connectivity sub-system 125, near field communication (NFC) controller 130, audio driver 135, camera driver 140, touch screen 145, display driver 150, sensors 155, removable memory 160, power management integrated circuit (PMIC) 165, and smart battery 170.

In some aspects, application processor 105 may include, for example, one or more central processing unit (CPU) cores and one or more of cache memory, low drop-out voltage regulators (LDOs), interrupt controllers, serial interfaces such as SPI, I2C or universal programmable serial interface sub-system, real time clock (RTC), timer-counters including interval and watchdog timers, general purpose IO, memory card controllers such as SD/MMC or similar, USB interfaces, MIPI interfaces, and/or Joint Test Access Group (JTAG) test access ports.

In some aspects, baseband processor 110 may be implemented, for example, as a solder-down substrate including one or more integrated circuits, a single packaged integrated circuit soldered to a main circuit board, and/or a multi-chip module including two or more integrated circuits.

Applications of mmWave technology can include, for example, WiGig and future 5G, but the mmWave technology can be applicable to a variety of telecommunications systems. The mmWave technology can be especially attractive for short-range telecommunications systems. WiGig devices operate in the unlicensed 60 GHz band, whereas 5G mmWave is expected to operate initially in the licensed 28 GHz and 39 GHz bands. A block diagram of an example baseband processor 110 and RFEM 115 in a mmWave system is shown in FIG. 1A.

Figure 1A:
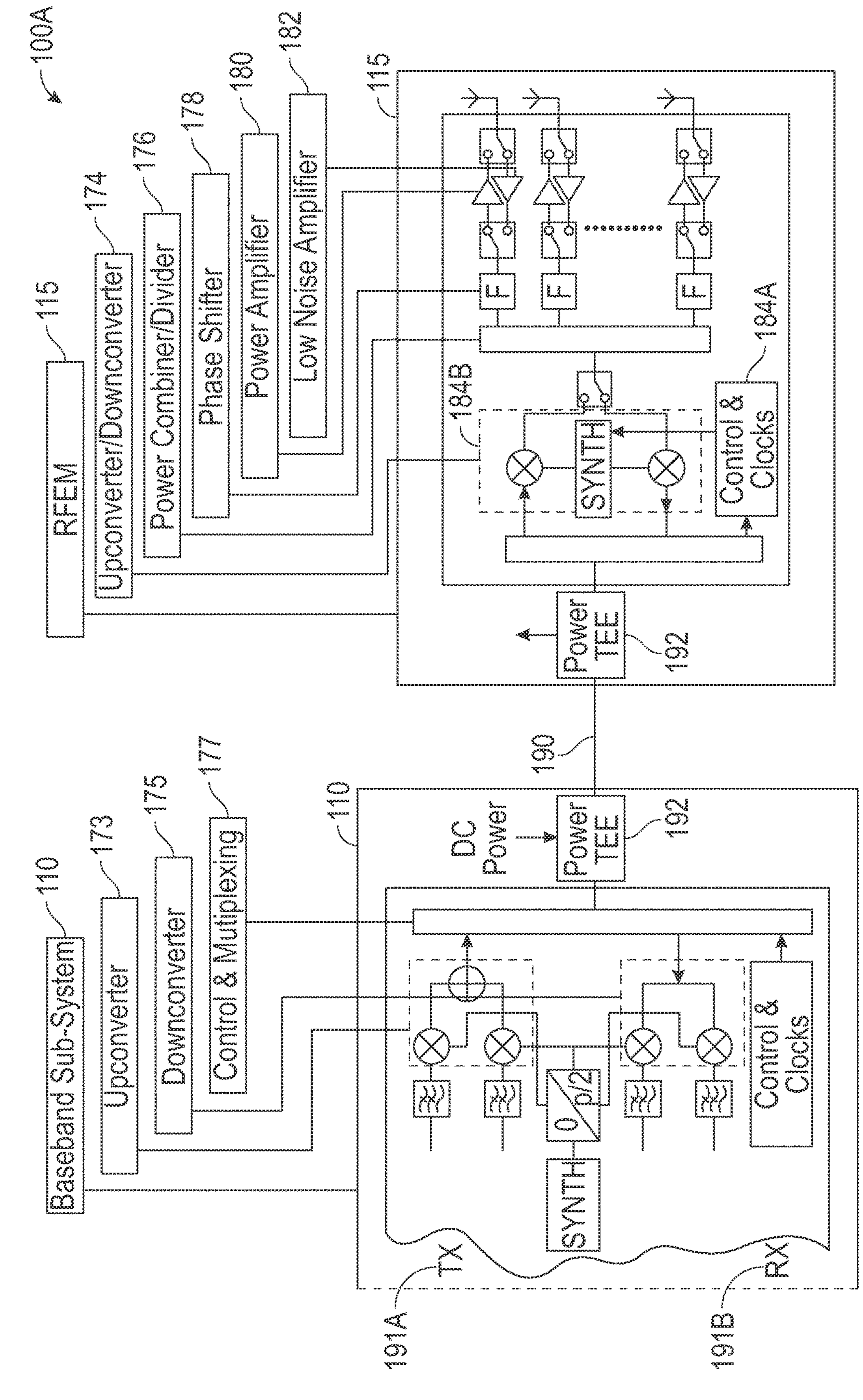
FIG. 1A illustrates a mmWave system, which can be used in connection with the device of FIG. 1 according to some aspects.

FIG. 1A illustrates a mmWave system 100A, which can be used in connection with the device 100 of FIG. 1 according to some aspects of the present disclosure. The system 100A includes two components: a baseband processor 110 and one or more radio front end modules (RFEMs) 115. The RFEM 115 can be connected to the baseband processor 110 by a single coaxial cable 190, which supplies a modulated intermediate frequency (IF) signal, DC power, clocking signals and control signals.

The baseband processor 110 is not shown in its entirety, but FIG. 1A rather shows an implementation of analog front end. This includes a transmitter (TX) section 191A with an upconverter 173 to intermediate frequency (IF) (around 10 GHz in current implementations), a receiver (RX) section 191B with downconversion 175 from IF to baseband, control and multiplexing circuitry 177 including a combiner to multiplex/demultiplex transmit and receive signals onto a single cable 190. In addition, power tee circuitry 192 (which includes discrete components) is included on the baseband circuit board to provide DC power for the RFEM 115. In some aspects, the combination of the TX section and RX section may be referred to as a transceiver, to which may be coupled one or more antennas or antenna arrays of the types described herein.

The RFEM 115 can be a small circuit board including a number of printed antennas and one or more RF devices containing multiple radio chains, including upconversion/downconversion 174 to millimeter wave frequencies, power combiner/divider 176, programmable phase shifting 178 and power amplifiers (PA) 180, low noise amplifiers (LNA) 182, as well as control and power management circuitry 184A and 184B. This arrangement can be different from Wi-Fi or cellular implementations, which generally have all RF and baseband functionality integrated into a single unit and only antennas connected remotely via coaxial cables.

This architectural difference can be driven by the very large power losses in coaxial cables at millimeter wave frequencies. These power losses can reduce the transmit power at the antenna and reduce receive sensitivity. In order to avoid this issue, in some aspects, PAs 180 and LNAs 182 may be moved to the RFEM 115 with integrated antennas. In addition, the RFEM 115 may include upconversion/downconversion 174 so that the IF signals over the coaxial cable 190 can be at a lower frequency. Additional system context for mmWave 5G apparatuses, techniques and features is discussed herein below.

Figure 2:
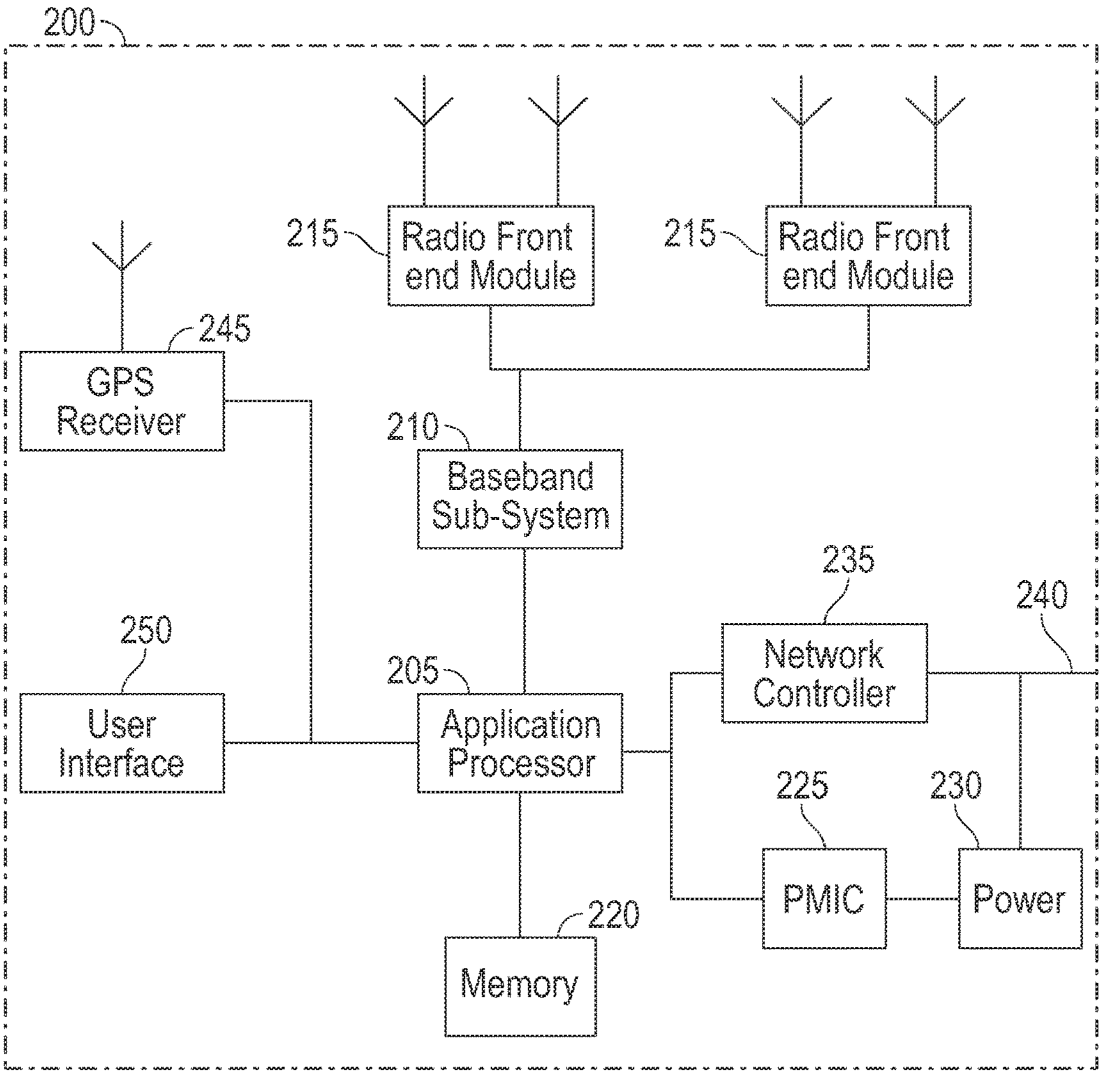
FIG. 2 illustrates an exemplary base station radio head according to some aspects.

FIG. 2 illustrates an exemplary base station or infrastructure equipment radio head according to some aspects. The base station radio head 200 may include one or more of application processor 205, baseband processors 210, one or more radio front end modules 215, memory 220, power management integrated circuitry (PMIC) 225, power tee circuitry 230, network controller 235, network interface connector 240, satellite navigation receiver (e.g., GPS receiver) 245, and user interface 250.

In some aspects, application processor 205 may include one or more CPU cores and one or more of cache memory, low drop-out voltage regulators (LDOs), interrupt controllers, serial interfaces such as SPI, I2C or universal programmable serial interface, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip sub-system including two or more integrated circuits.

In some aspects, memory 220 may include one or more of volatile memory including dynamic random access memory (DRAM) and/or synchronous DRAM (SDRAM), and non-volatile memory (NVM) including high-speed electrically erasable memory (commonly referred to as Flash memory), phase-change random access memory (PRAM), magnetoresistive random access memory (MRAM), and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable. Power tee circuitry 230 may provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide, to application processor 205, data which may include one or more of position data or time data. Time data may be used by application processor 205 to synchronize operations with other radio base stations or infrastructure equipment.

In some aspects, user interface 250 may include one or more of buttons. The buttons may include a reset button. User interface 250 may also include one or more indicators such as LEDs and a display screen.

Figure 3A:
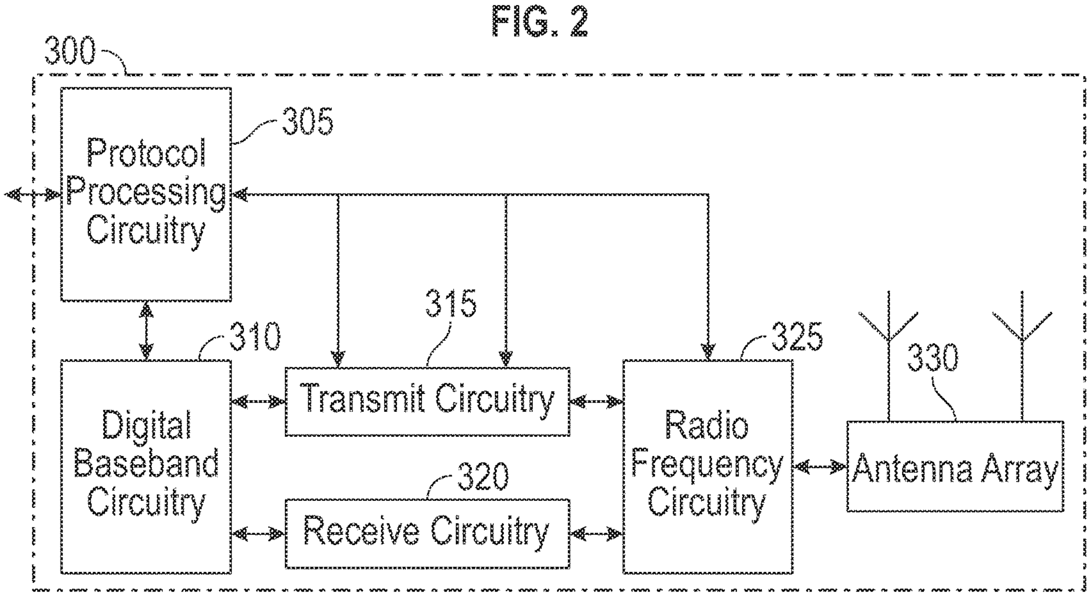
FIG. 3A illustrates exemplary wireless communication circuitry according to some aspects.
Figure 3B:
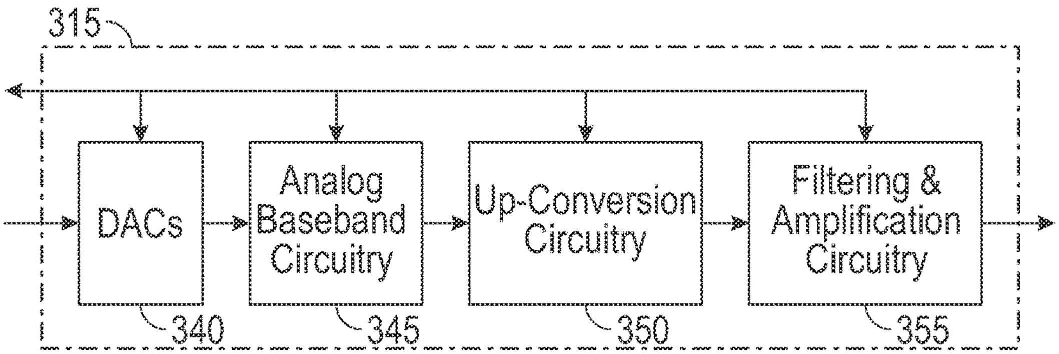
FIG. 3B illustrates aspects of exemplary transmit circuitry illustrated in FIG. 3A according to some aspects.
Figure 3C:
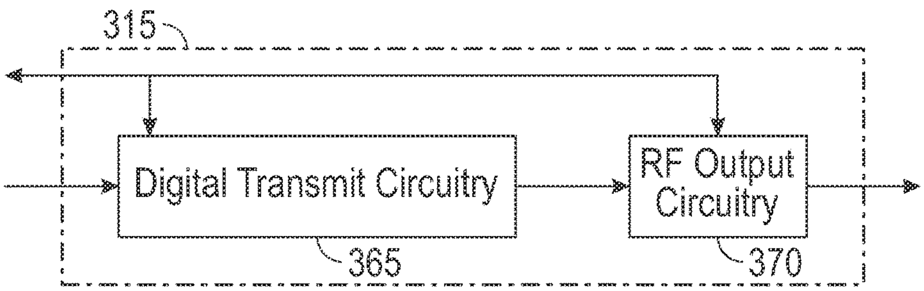
FIG. 3C illustrates aspects of exemplary transmit circuitry illustrated in FIG. 3A according to some aspects.
Figure 3D:
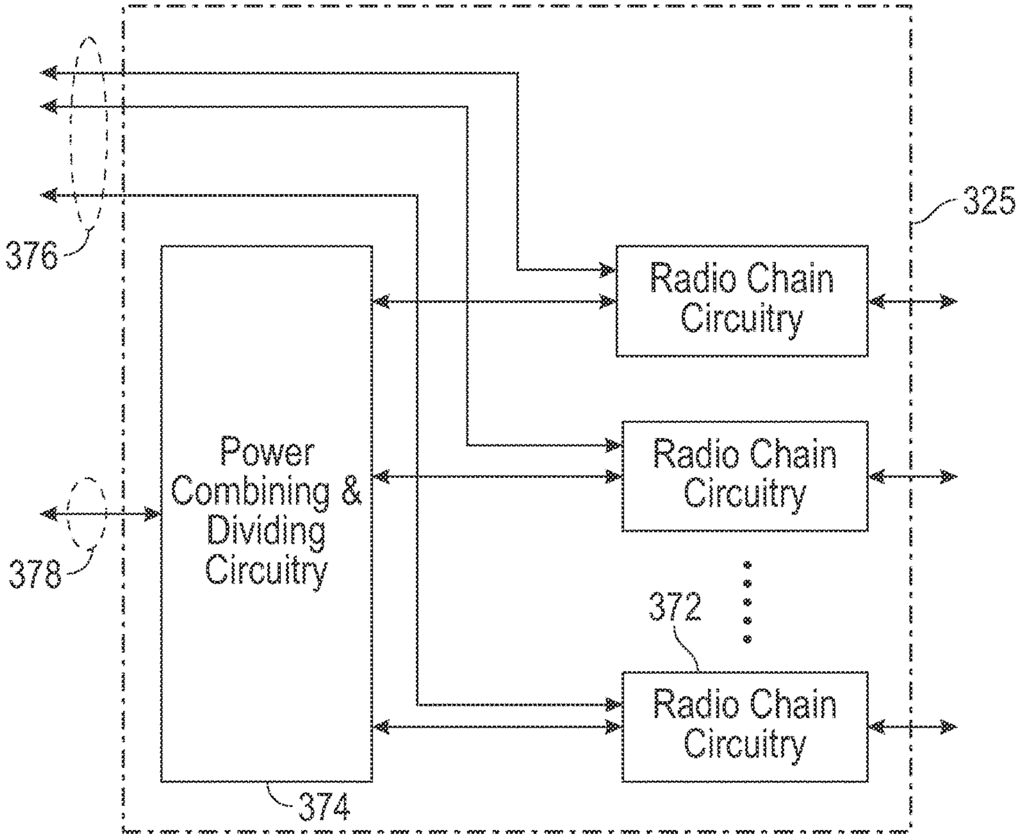
FIG. 3D illustrates aspects of exemplary radio frequency circuitry illustrated in FIG. 3A according to some aspects.
Figure 3E:
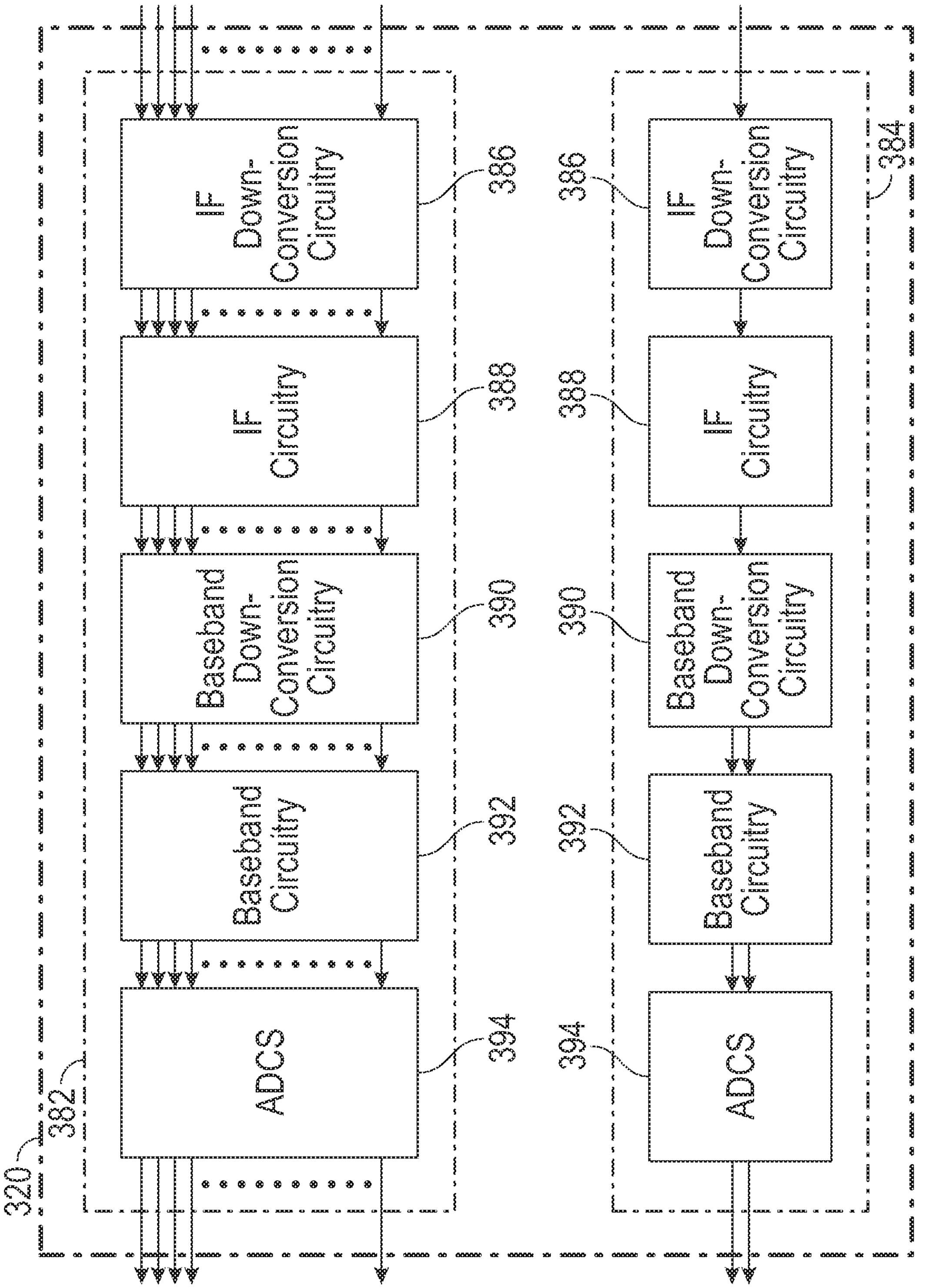
FIG. 3E illustrates aspects of exemplary receive circuitry in FIG. 3A according to some aspects.

FIG. 3A illustrates exemplary wireless communication circuitry according to some aspects; FIGS. 3B and 3C illustrate aspects of transmit circuitry shown in FIG. 3A according to some aspects; FIG. 3D illustrates aspects of radio frequency circuitry shown in FIG. 3A according to some aspects; FIG. 3E illustrates aspects of receive circuitry in FIG. 3A according to some aspects. Wireless communication circuitry 300 shown in FIG. 3A may be alternatively grouped according to functions. Components illustrated in FIG. 3A are provided here for illustrative purposes and may include other components not shown in FIG. 3A.

Wireless communication circuitry 300 may include protocol processing circuitry 305 (or processor) or other means for processing. Protocol processing circuitry 305 may implement one or more of medium access control (MAC), radio link control (RLC), packet data convergence protocol (PDCP), radio resource control (RRC) and non-access stratum (NAS) functions, among others. Protocol processing circuitry 305 may include one or more processing cores to execute instructions and one or more memory structures to store program and data information.

Wireless communication circuitry 300 may further include digital baseband circuitry 310. Digital baseband circuitry 310 may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Wireless communication circuitry 300 may further include transmit circuitry 315, receive circuitry 320 and/or antenna array circuitry 330. Wireless communication circuitry 300 may further include RF circuitry 325. In some aspects, RF circuitry 325 may include one or multiple parallel RF chains for transmission and/or reception. Each of the RF chains may be connected to one or more antennas of antenna array circuitry 330.

In some aspects, protocol processing circuitry 305 may include one or more instances of control circuitry. The control circuitry may provide control functions for one or more of digital baseband circuitry 310, transmit circuitry 315, receive circuitry 320, and/or RF circuitry 325.

FIGS. 3B and 3C illustrate aspects of transmit circuitry shown in FIG. 3A according to some aspects. Transmit circuitry 315 shown in FIG. 3B may include one or more of digital to analog converters (DACs) 340, analog baseband circuitry 345, up-conversion circuitry 350 and/or filtering and amplification circuitry 355. DACs 340 may convert digital signals into analog signals. Analog baseband circuitry 345 may perform multiple functions as indicated below. Up-conversion circuitry 350 may up-convert baseband signals from analog baseband circuitry 345 to RF frequencies (e.g., mmWave frequencies). Filtering and amplification circuitry 355 may filter and amplify analog signals. Control signals may be supplied between protocol processing circuitry 305 and one or more of DACs 340, analog baseband circuitry 345, up-conversion circuitry 350 and/or filtering and amplification circuitry 355.

Transmit circuitry 315 shown in FIG. 3C may include digital transmit circuitry 365 and RF circuitry 370. In some aspects, signals from filtering and amplification circuitry 355 may be provided to digital transmit circuitry 365. As above, control signals may be supplied between protocol processing circuitry 305 and one or more of digital transmit circuitry 365 and RF circuitry 370.

FIG. 3D illustrates aspects of radio frequency circuitry shown in FIG. 3A according to some aspects. Radio frequency circuitry 325 may include one or more instances of radio chain circuitry 372, which in some aspects may include one or more filters, power amplifiers, low noise amplifiers, programmable phase shifters and power supplies.

Radio frequency circuitry 325 may also in some aspects include power combining and dividing circuitry 374. In some aspects, power combining and dividing circuitry 374 may operate bidirectionally, such that the same physical circuitry may be configured to operate as a power divider when the device is transmitting, and as a power combiner when the device is receiving. In some aspects, power combining and dividing circuitry 374 may include one or more wholly or partially separate circuitries to perform power dividing when the device is transmitting and power combining when the device is receiving. In some aspects, power combining and dividing circuitry 374 may include passive circuitry including one or more two-way power divider/combiners arranged in a tree. In some aspects, power combining and dividing circuitry 374 may include active circuitry including amplifier circuits.

In some aspects, radio frequency circuitry 325 may connect to transmit circuitry 315 and receive circuitry 320 in FIG. 3A. Radio frequency circuitry 325 may connect to transmit circuitry 315 and receive circuitry 320 via one or more radio chain interfaces 376 and/or a combined radio chain interface 378. In some aspects, one or more radio chain interfaces 376 may provide one or more interfaces to one or more receive or transmit signals, each associated with a single antenna structure. In some aspects, the combined radio chain interface 378 may provide a single interface to one or more receive or transmit signals, each associated with a group of antenna structures.

FIG. 3E illustrates aspects of receive circuitry in FIG. 3A according to some aspects. Receive circuitry 320 may include one or more of parallel receive circuitry 382 and/or one or more of combined receive circuitry 384. In some aspects, the one or more parallel receive circuitry 382 and one or more combined receive circuitry 384 may include one or more Intermediate Frequency (IF) down-conversion circuitry 386, IF processing circuitry 388, baseband down-conversion circuitry 390, baseband processing circuitry 392 and analog-to-digital converter (ADC) circuitry 394. As used herein, the term “intermediate frequency” refers to a frequency to which a carrier frequency (or a frequency signal) is shifted as in intermediate step in transmission, reception, and/or signal processing. IF down-conversion circuitry 386 may convert received RF signals to IF. IF processing circuitry 388 may process the IF signals, e.g., via filtering and amplification. Baseband down-conversion circuitry 390 may convert the signals from IF processing circuitry 388 to baseband. Baseband processing circuitry 392 may process the baseband signals, e.g., via filtering and amplification. ADC circuitry 394 may convert the processed analog baseband signals to digital signals.

Figure 4:
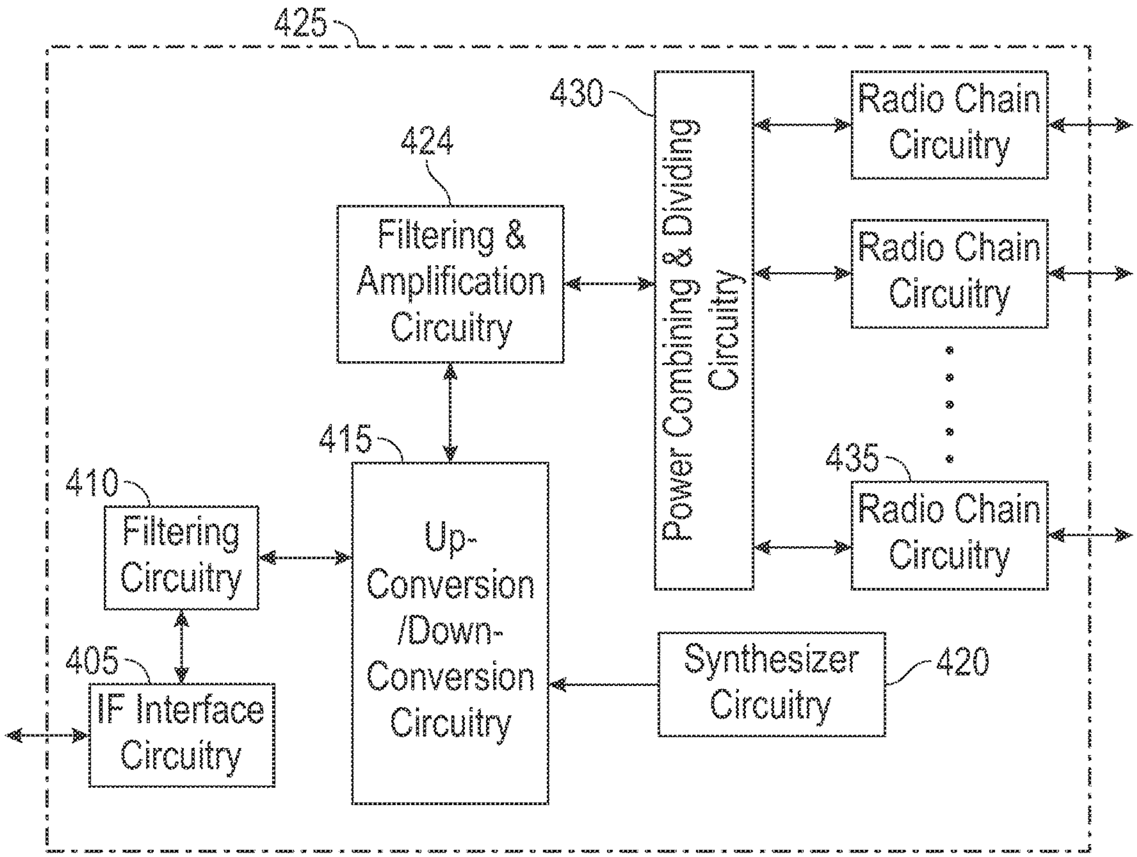
FIG. 4 illustrates exemplary useable RF circuitry in FIG. 3A according to some aspects.

FIG. 4 illustrates exemplary RF circuitry of FIG. 3A according to some aspects. In an aspect, RF circuitry 325 in FIG. 3A (depicted in FIG. 4 using reference number 425) may include one or more of the IF interface circuitry 405, filtering circuitry 410, up-conversion and down-conversion circuitry 415, synthesizer circuitry 420, filtering and amplification circuitry 424, power combining and dividing circuitry 430, and radio chain circuitry 435.

Figure 5A:
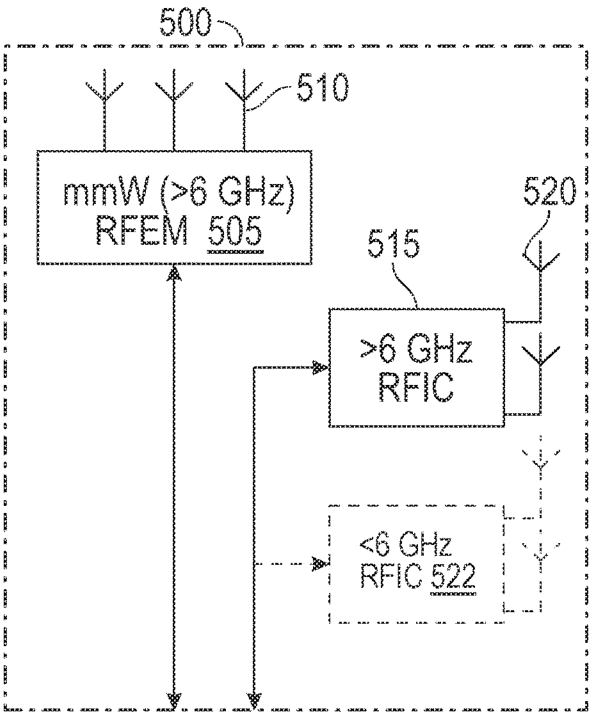
FIG. 5A illustrates an aspect of an exemplary radio front end module (RFEM) according to some aspects.
Figure 5B:
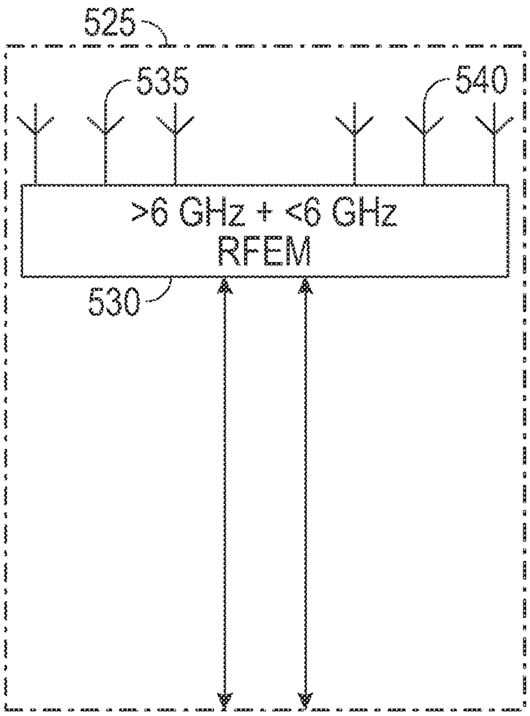
FIG. 5B illustrates an alternate aspect of an exemplary radio front end module, according to some aspects.

FIG. 5A and FIG. 5B illustrate aspects of a radio front-end module (RFEM) useable in the circuitry shown in FIG. 1 and FIG. 2, according to some aspects. FIG. 5A illustrates an aspect of a RFEM according to some aspects. RFEM 500 incorporates a millimeter wave RFEM 505 and one or more above-six gigahertz radio frequency integrated circuits (RFIC) 515 and/or one or more sub-six gigahertz RFICs 522. In this aspect, the one or more sub-six gigahertz RFICs 515 and/or one or more sub-six gigahertz RFICs 522 may be physically separated from millimeter wave RFEM 505. RFICs 515 and 522 may include connection to one or more antennas 520. RFEM 505 may include multiple antennas 510.

FIG. 5B illustrates an alternate aspect of a radio front end module 525, according to some aspects. In this aspect, both millimeter wave and sub-six gigahertz radio functions may be implemented in the same physical radio front end module (RFEM) 530. RFEM 530 may incorporate both millimeter wave antennas 535 and sub-six gigahertz antennas 540.

Figure 6:
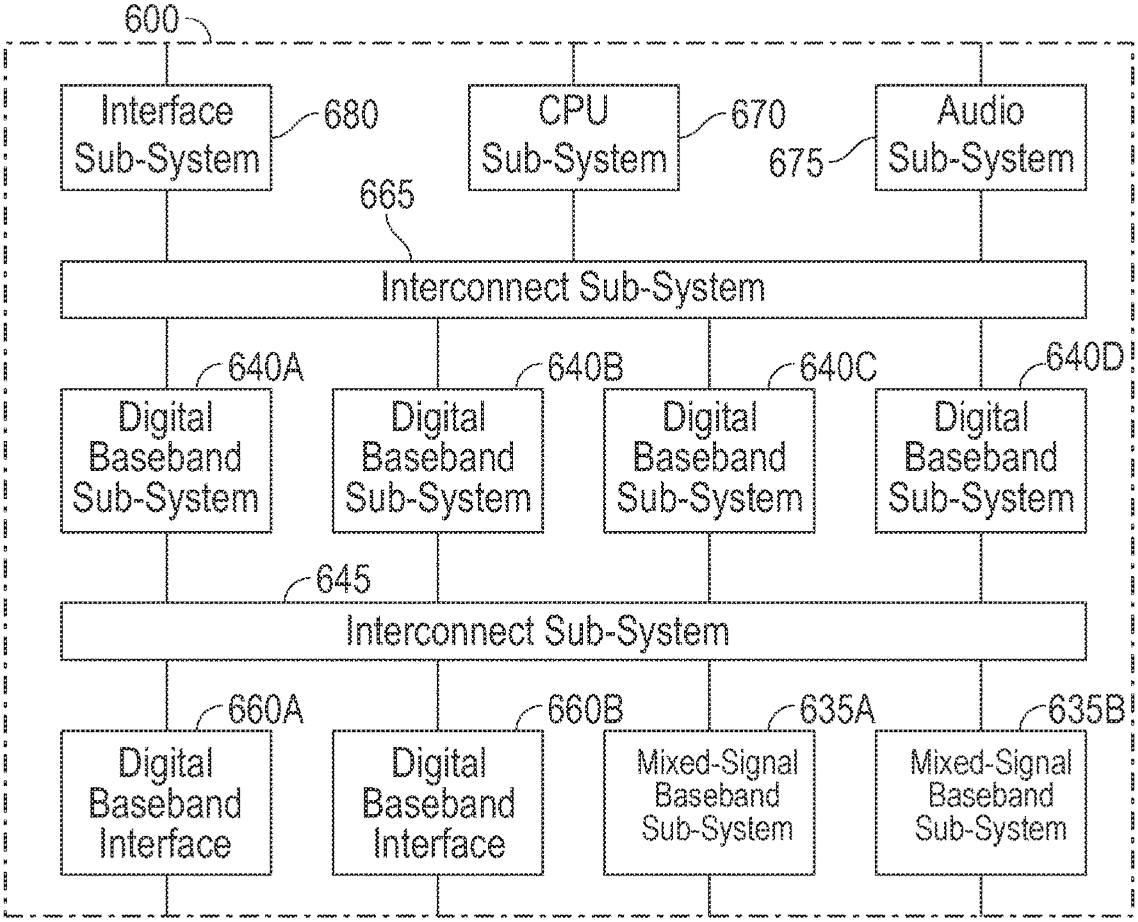
FIG. 6 illustrates an exemplary multi-protocol baseband processor useable in FIG. 1 or FIG. 2, according to some aspects.

FIG. 6 illustrates a multi-protocol baseband processor 600 useable in the system and circuitry shown in FIG. 1 or FIG. 2, according to some aspects. In an aspect, baseband processor may contain one or more digital baseband subsystems 640A, 640B, 640C, 640D, also herein referred to collectively as digital baseband subsystems 640.

In an aspect, the one or more digital baseband subsystems 640A, 640B, 640C, 640D may be coupled via interconnect subsystem 665 to one or more of CPU subsystem 670, audio subsystem 675 and interface subsystem 680. In an aspect, the one or more digital baseband subsystems 640 may be coupled via interconnect subsystem 645 to one or more of each of digital baseband interface 660A, 660B and mixed-signal baseband subsystem 635A, 635B.

In an aspect, interconnect subsystem 665 and 645 may each include one or more of each of buses point-to-point connections and network-on-chip (NOC) structures. In an aspect, audio subsystem 675 may include one or more of digital signal processing circuitry, buffer memory, program memory, speech processing accelerator circuitry, data converter circuitry such as analog-to-digital and digital-to-analog converter circuitry, and analog circuitry including one or more of amplifiers and filters.

Figure 7:
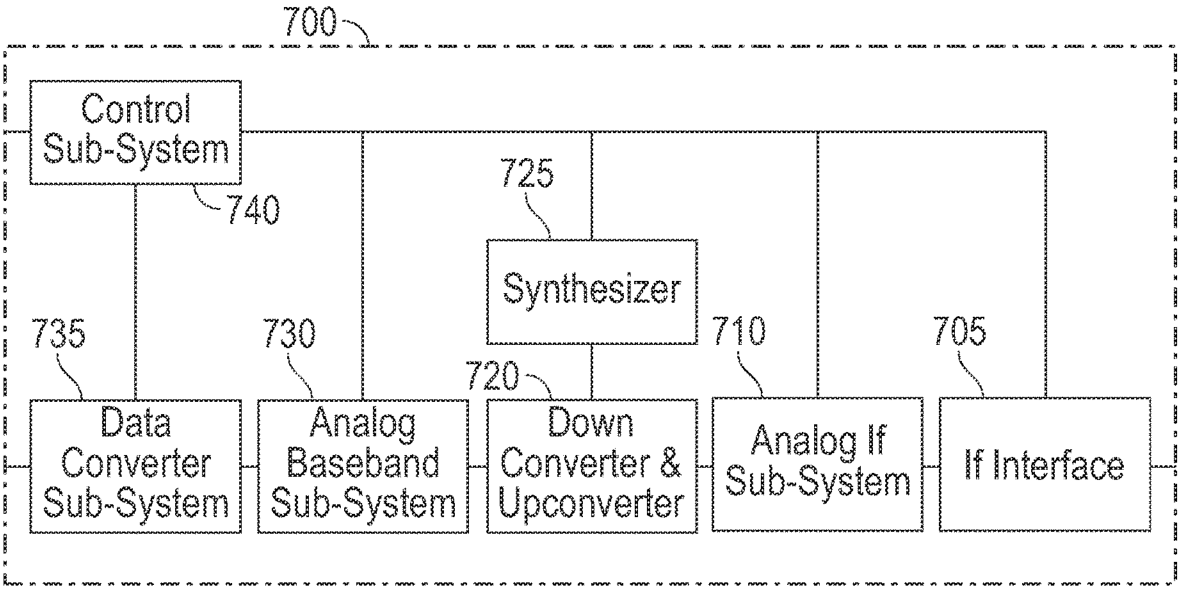
FIG. 7 illustrates an exemplary mixed signal baseband subsystem, according to some aspects.

FIG. 7 illustrates an exemplary of a mixed signal baseband subsystem 700, according to some aspects. In an aspect, mixed signal baseband subsystem 700 may include one or more of IF interface 705, analog IF subsystem 710, down-converter and up-converter subsystem 720, analog baseband subsystem 730, data converter subsystem 735, synthesizer 725 and control subsystem 740.

Figure 8A:
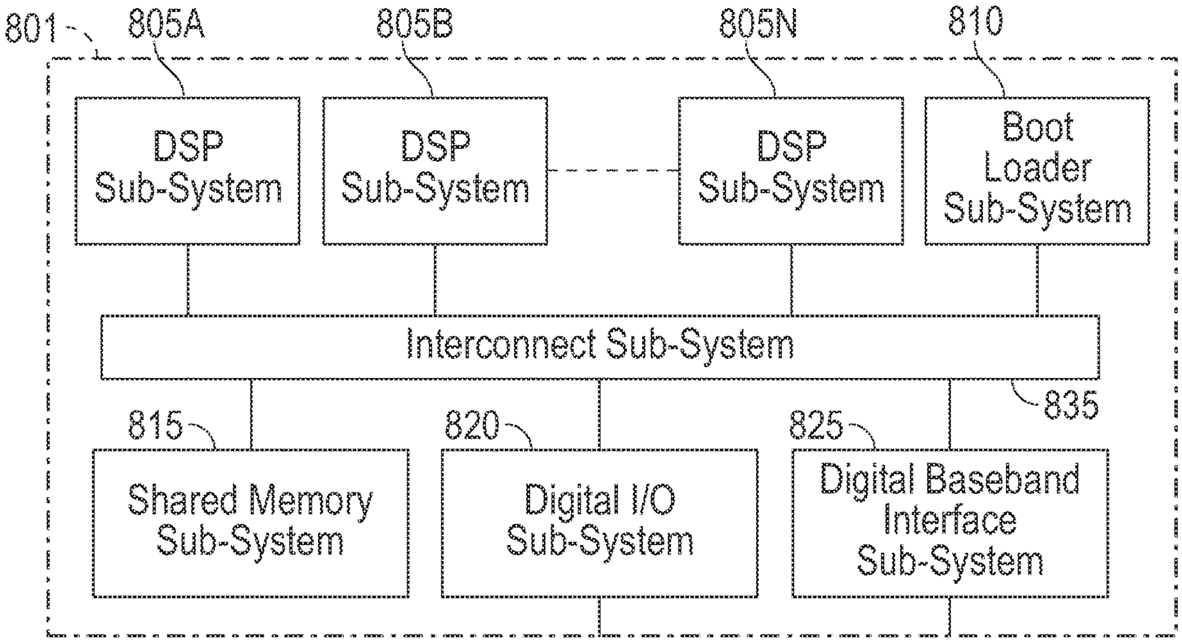
FIG. 8A illustrates an exemplary digital baseband subsystem, according to some aspects.
Figure 8B:
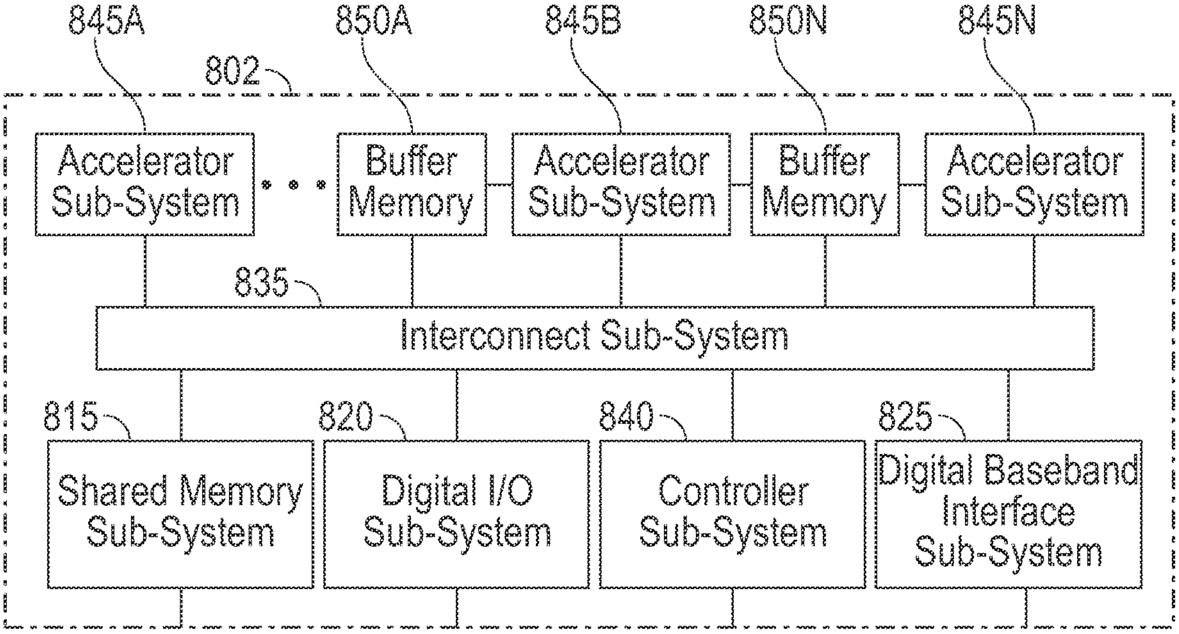
FIG. 8B illustrates an alternate aspect of an exemplary baseband processing subsystem, according to some aspects.

FIG. 8A illustrates a digital baseband processing subsystem 801, according to some aspects. FIG. 8B illustrates an alternate aspect of a digital baseband processing subsystem 802, according to some aspects.

In an aspect of FIG. 8A, the digital baseband processing subsystem 801 may include one or more of each of digital signal processor (DSP) subsystems 805A, 805B, . . . 805N, interconnect subsystem 835, boot loader subsystem 810, shared memory subsystem 815, digital I/O subsystem 820, and digital baseband interface subsystem 825.

In an aspect of FIG. 8B, digital baseband processing subsystem 802 may include one or more of each of accelerator subsystem 845A, 845B, . . . 845N, buffer memory 850A, 850B, . . . 850N, interconnect subsystem 835, shared memory subsystem 815, digital I/O subsystem 820, controller subsystem 840 and digital baseband interface subsystem 825.

In an aspect, boot loader subsystem 810 may include digital logic circuitry configured to perform configuration of the program memory and running state associated with each of the one or more DSP subsystems 805. Configuration of the program memory of each of the one or more DSP subsystems 805 may include loading executable program code from storage external to digital baseband processing subsystems 801 and 802. Configuration of the running state associated with each of the one or more DSP subsystems 805 may include one or more of the steps of: setting the state of at least one DSP core which may be incorporated into each of the one or more DSP subsystems 805 to a state in which it is not running, and setting the state of at least one DSP core which may be incorporated into each of the one or more DSP subsystems 805 into a state in which it begins executing program code starting from a predefined memory location.

In an aspect, shared memory subsystem 815 may include one or more of read-only memory (ROM), static random access memory (SRAM), embedded dynamic random access memory (eDRAM) and/or non-volatile random access memory (NVRAM).

In an aspect, digital I/O subsystem 820 may include one or more of serial interfaces such as Inter-Integrated Circuit (I2C), Serial Peripheral Interface (SPI) or other 1, 2 or 3-wire serial interfaces, parallel interfaces such as general-purpose input-output (GPIO), register access interfaces and direct memory access (DMA). In an aspect, a register access interface implemented in digital I/O subsystem 820 may permit a microprocessor core external to digital baseband processing subsystem 801 to read and/or write one or more of control and data registers and memory. In an aspect, DMA logic circuitry implemented in digital I/O subsystem 820 may permit transfer of contiguous blocks of data between memory locations including memory locations internal and external to digital baseband processing subsystem 801.

In an aspect, digital baseband interface subsystem 825 may provide for the transfer of digital baseband samples between baseband processing subsystem and mixed signal baseband or radio-frequency circuitry external to digital baseband processing subsystem 801. In an aspect, digital baseband samples transferred by digital baseband interface subsystem 825 may include in-phase and quadrature (I/Q) samples.

In an aspect, controller subsystem 840 may include one or more of each of control and status registers and control state machines. In an aspect, control and status registers may be accessed via a register interface and may provide for one or more of: starting and stopping operation of control state machines, resetting control state machines to a default state, configuring optional processing features, and/or configuring the generation of interrupts and reporting the status of operations. In an aspect, each of the one or more control state machines may control the sequence of operation of each of the one or more accelerator subsystems 845. There may be examples of implementations of both FIG. 8A and FIG. 8B in the same baseband subsystem.

Figure 9:
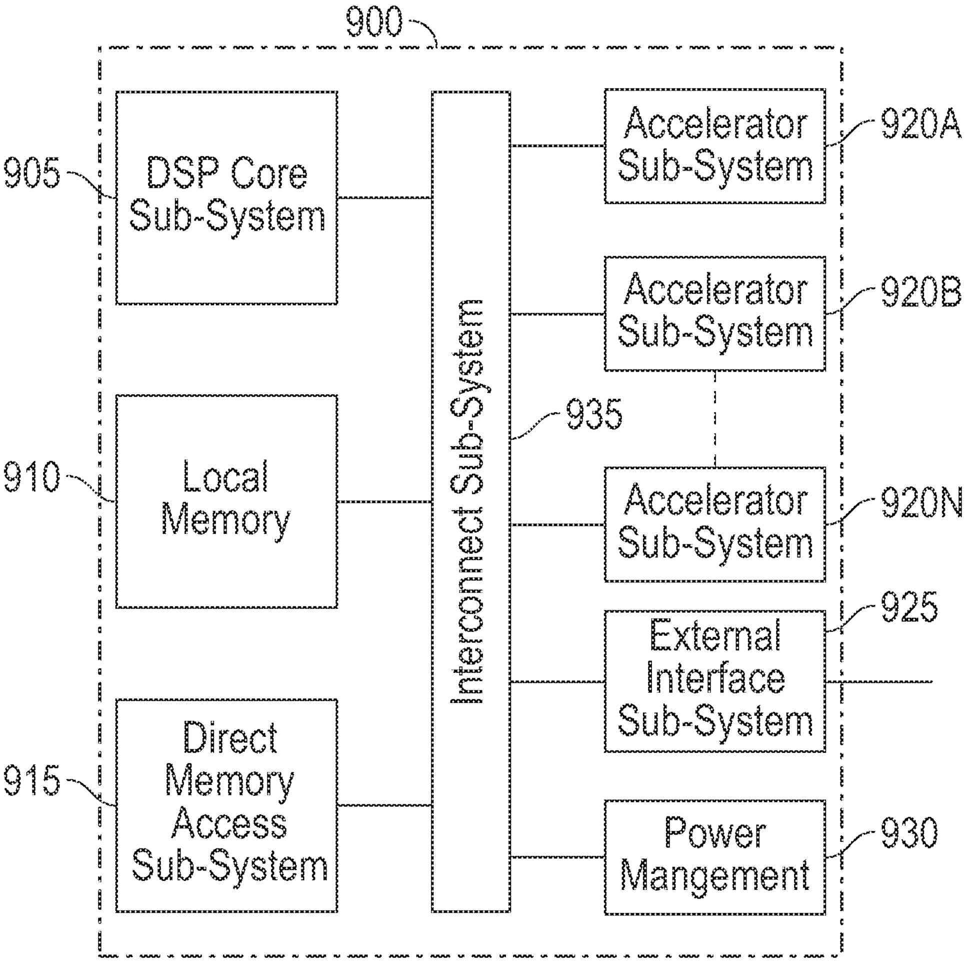
FIG. 9 illustrates an exemplary digital signal processor subsystem, according to some aspects.

FIG. 9 illustrates a digital signal processor (DSP) subsystem 900 according to some aspects. In an aspect, DSP subsystem 900 may include one or more of each of DSP core subsystem 905, local memory 910, direct memory access (DMA) subsystem 915, accelerator subsystem 920A, 920B . . . 920N, external interface subsystem 925, power management circuitry 930 and interconnect subsystem 935.

In an aspect, the local memory 910 may include one or more of each of read-only memory, static random access memory or embedded dynamic random access memory.

In an aspect, the DMA subsystem 915 may provide registers and control state machine circuitry adapted to transfer blocks of data between memory locations including memory locations internal and external to DSP subsystem 900.

In an aspect, external interface subsystem 925 may provide for access by a microprocessor system external to DSP subsystem 900 to one or more of memory, control registers and status registers which may be implemented in DSP subsystem 900. In an aspect, external interface subsystem 925 may provide for transfer of data between local memory 910 and storage external to DSP subsystem 900 under the control of one or more of the DMA subsystem 915 and the DSP core subsystem 905.

Radio Frequency Switch

Figure 10:
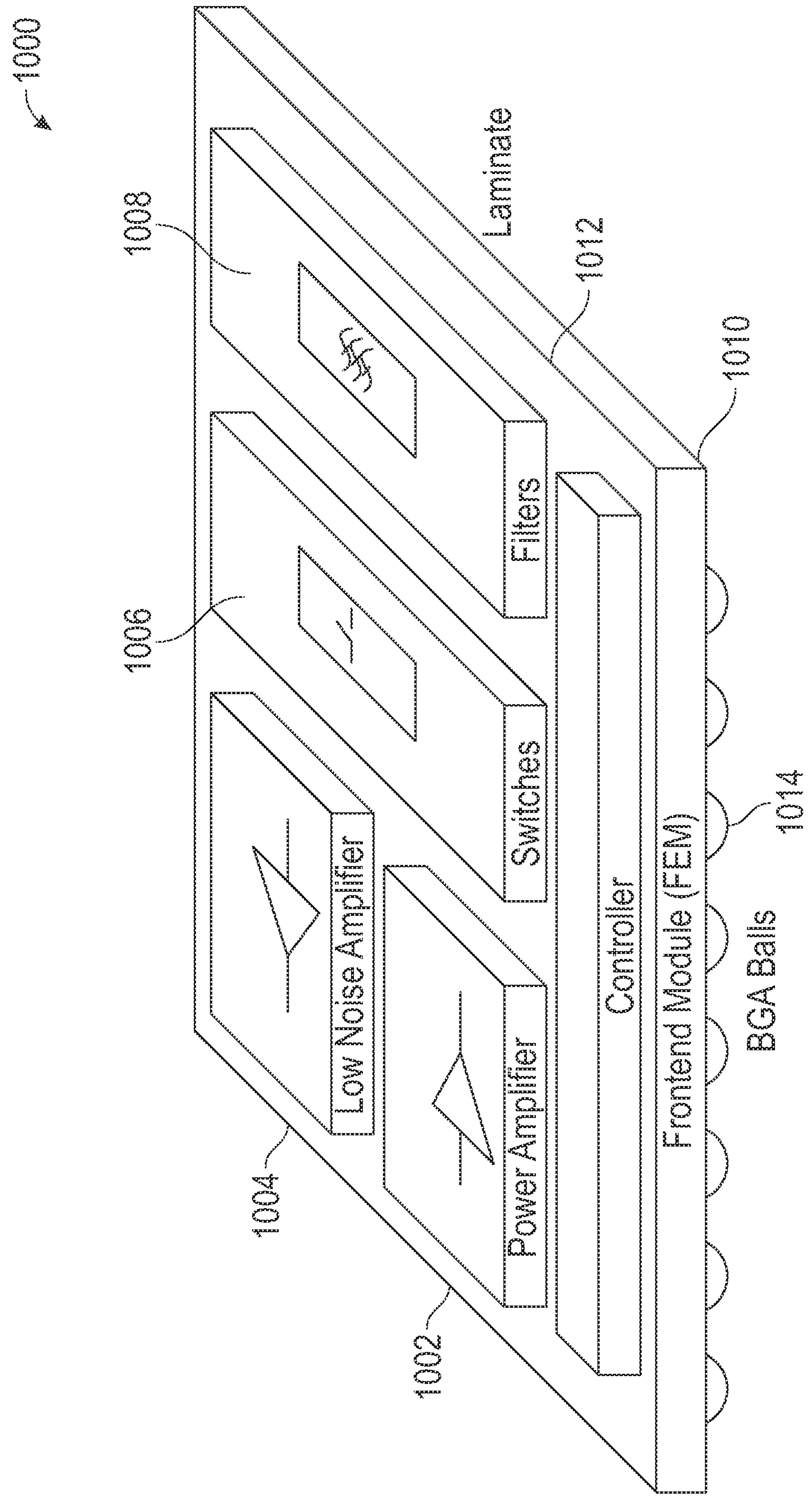
FIG. 10 illustrates a perspective view of a front end module according to some aspects.

FIG. 10 illustrates a perspective view of a front end module 1000 according to some aspects. As described above, a front end module (FEM) 1000 is a small built-in module integrated with various discrete functional components. The FEM includes multiple discrete components, such as the power amplifier 1002, low noise amplifier 1004, an antenna switch module (ASM) 1006, filter 1008, matching network, and controller 1010, as illustrated. The power amplifier 1002 is to increase the input signal for transmitter (TX) to a level high enough to drive the ASM 1006 and matching networks (MN). The low noise amplifier 1004 is employed in the receiver (RX) path to increase the very level low signal received by the antenna without introducing significant extra noise. The controller 1010 is to communicate with other part of the communication system, such as transceiver, processor, or baseband unit (BBU) as described earlier herein. The controller 1010 receives the data, processes the received data, and generates the outputs to control the FEM components or sub-modules for enabling, disabling, or tunning. The ASM 1006 is to enable, disable, or steer the signals for TX path, RX path, or both. The laminate package 1012 with ball grid array (BGA) 1014 integrates the discrete components together, as shown in FIG. 10 to connect signals to an underlying printed circuit board (PCB) not shown in FIG. 10.

The wireless system contains multiple radios and multiple antennas. The ASM 1006 allows the TX power amplifier 1002 outputs to select the best antenna for a desired band and isolates other radios simultaneously. The ASM 1006 can be designed for different architectures. A typical single-pole double-throw (SPDT) switch is used to couple the shared antenna for both TX and RX to the receiver and transmitter for the time division duplex (TDD) communication systems. In the ASM 1006, a coupler with feedback receiver switches may be integrated to save cost. The FEM controller 1010 may also be integrated into the ASM 1006.

Figure 11:
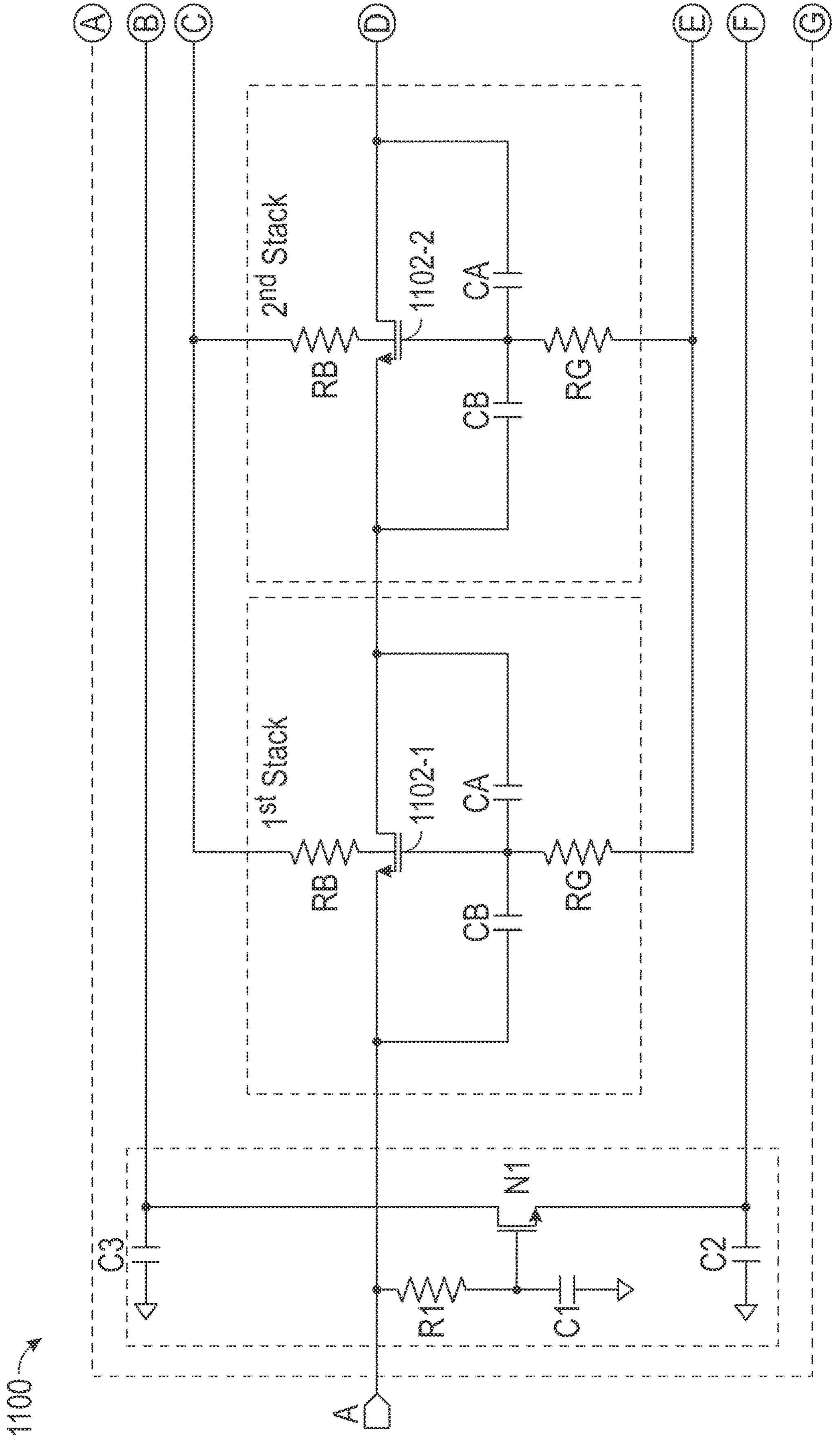
FIG. 11 illustrates a schematic of a stacked switch according to some aspects.
Figure 11:
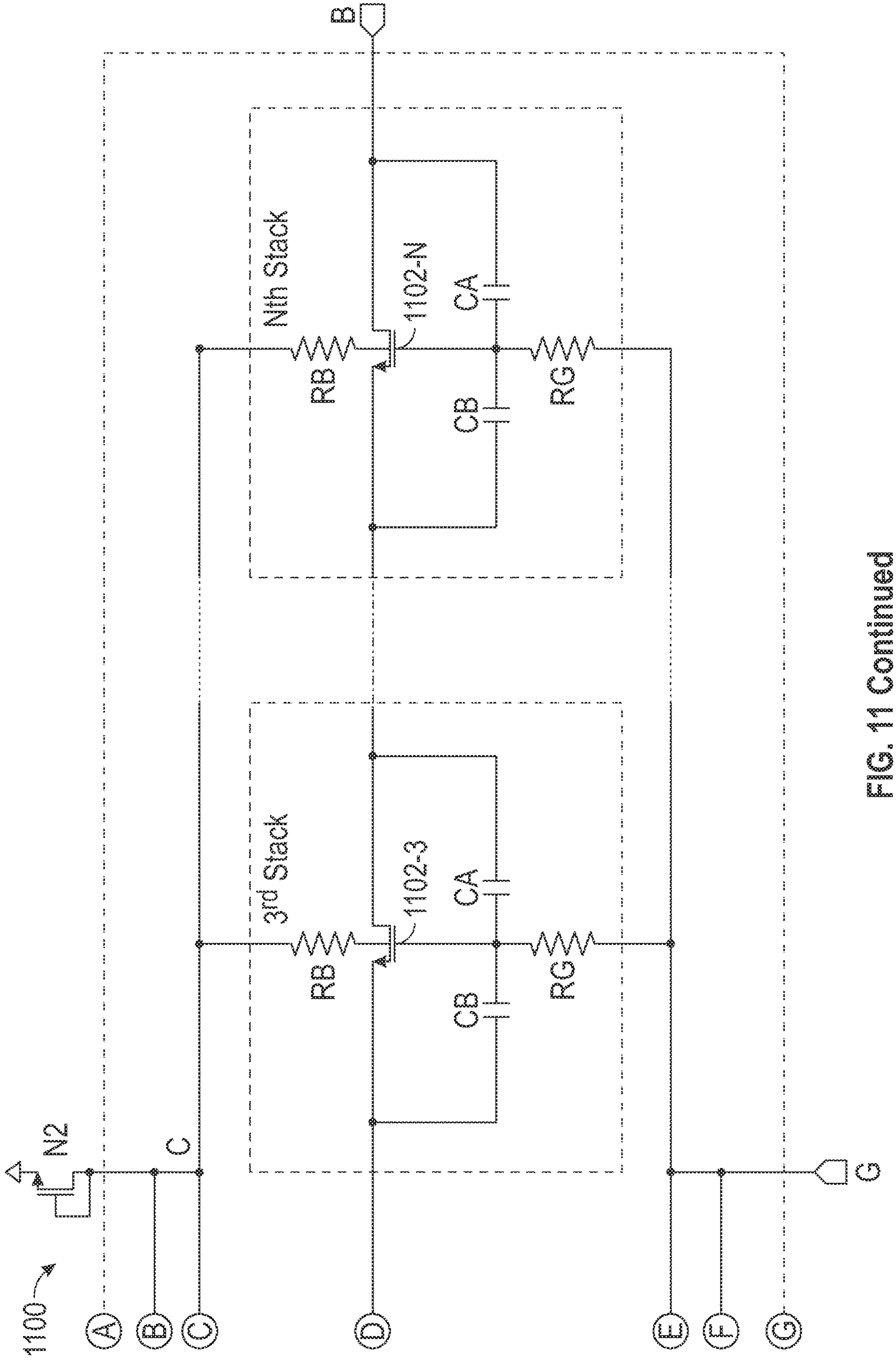

The switch according to aspects can contain a plurality of branches, with a branch comprised of a plurality of stacked metal-oxide-semiconductor field effect transistor (MOSFET) switch units, as shown in FIG. 11. In some aspects, a MOSFET can comprise an NMOS.

FIG. 11 illustrates a schematic of a stacked switch 1100 according to some aspects. In each stack, CA is the parasitic capacitance between a drain terminal and gate terminal of the respective NMOS 1102-1, 1102-2, 1102-3 and 1102-N, and CB is the parasitic capacitance between source terminal and gate terminal of the NMOS 1102-1, 1102-2, 1102-3, 1102-N. RG and RB can comprise resistive elements to block the AC signals from gate and body. R1 and C1 form a signal filter and set the gate DC bias of N1 the same as node A and node B. C2 can comprise a noise filtering capacitive element for the gate bias and C3 can comprise a noise filtering capacitive element of the body bias. N2 can comprise a NMOS device coupled to the body common DC bias node (e.g., node C) and the ground. The node B can be coupled to the antenna. A matching network may be coupled to node B and the antenna and is not shown in FIG. 11. The bias circuitry (N1, R1, C1) is located at the other terminal of the switch (e.g., node A) and can reduce the N1 gate ESD attack from node B. The stacked switches, R1, C1 can reduce the ESD introduced voltage stress on the N1 gate. N1 and N2 can comprise long channel small width NMOS devices.

The operation states of the multiple stacked NMOS switch 1100 can be either ON-state or OFF-state. In ON-state, the switch can connect the node A and B with low impedance. In OFF-state, the switch 1100 can isolate the node A and B with high impedance. A switch unit cell is described in further detail later herein. The gate and body of the NMOS in the unit cell can be coupled to resistive elements RG and RB to block the AC signals of the gate and body. The other terminals of the RG for all the unit can be joined together (node G) and share the common DC bias. The other terminals of the RB for other stacks can be joined together (e.g., at node C) and share the common DC bias.

In an ON-state, the gate bias node—G, can be biased at positive DC voltage potential (VHIGH_Positive). The gate of the NMOS—N1, can be coupled to node A with low pass filter (comprised of, for example, R1 and C1). The gate DC voltage of N1 can be set to zero. The source terminal of N1 can be coupled to the G node, which has high voltage potential. The N1 is in OFF-state, high resistance (Roff, N1) coupled to the C and G. The N2 can include diode connections (not shown in FIG. 11), combined with Roff, N1 and the high DC bias from node G. The DC potential of the node C can be around VTH of N2, which can be about 0.1 V to 0.3 V. N1 can be in an OFF state, with a high-resistance Roff coupled to nodes G and C. N2 is configured to have the diode connection (short gate and drain) and coupled to the high voltage potential node—G via the Roff A small DC current (from N2 drain terminal to source terminal) can set the N2 gate terminal and drain terminal (node C) close to VTH.

Each stack of the NMOS switch device can have a respective body coupled to the node C through a high resistive resistor (RB). The DC potential of each stack NMOS body can be around VTH of N2, which is smaller than the threshold voltage of the parasitic diode (close to 0.7 V) between the drain terminal and body of each stack NMOS. The parasitic diode (not shown in FIG. 11) between the drain terminal and body can be in off state, provided that the AC swings of the voltage at the drain terminal are smaller than (VTH, DIODE−VTH, N2). Similarly, the parasitic diode (not shown in FIG. 11) between the source terminal and body can be in an off state. The Ddb and Dsb are off during the signal transmission through the switch 1100. The body bias with VTH is traded off between the unit NMOS ON-state resistance (RON) and the parasitic diode dynamic leakage. If the body DC bias is too high, the transient swings cross the Ddb and Dsb can be higher than the diode threshold voltage and result in Ddb and Dsb dynamically forward biased introduced transient leaking current. If the body DC bias is too low, the Ddb and Dsb can have reverse biased current leakage. The low bias of the body also increases the unit NMOS ON-state resistance (RON) and degrades the insertion loss performance of the switch.

In the OFF-state, the gate bias node G can be biased at negative DC voltage potential (VLOW_Negative). The gate of the NMOS N1 can be coupled to the node A with low pass filter (R1 and C1). The gate DC voltage of N1 can be set to zero. The source terminal of N1 can be coupled to the G node, which has negative voltage potential. The N1 can be in the ON state, low resistance (Ron, N1) coupled to the C and G nodes. The DC potential of the node C can be the same as node G (e.g., N1 can short C and G together), which can be a negative voltage. Due to the diode connection of N1, the gate can be biased at negative voltage. The source of N1 can grounded, when N1 is in an off state. Each stack of the NMOS switch device can be body coupled to the node C through a high resistive resistor (RB). The DC potential of each stack NMOS body can be set to be negative, e.g., at the same voltage potential as the node G. Both the gate terminal and body terminal of NMOS switch device can be biased at negative with high resistors. When the switch is in an off state, the parasitic diodes—Ddb and Dsb are reversely biased.

When a level high signal applied at the input of the switch, this may result in the parasitic diode (Ddb, Dsb) transient current leaking (which can be referred to as body DC current leakage). The DC offset of the body terminal in each unit cell could be shift away from the common body DC biased value and results in DC current from either the positive supply rail or the negative supply rail. In the ON-state, the N1 is off to isolate the node G with body connections. The DC current of the control bias will be low. In the OFF-state, N1 is on, and N2 is off. No DC leakage current will be present from the ground (N2 is off). The negative bias (VLOW_Negative) of the unit cell NMOS body terminal will set the parasitic diodes (Ddb, Dsb) reverse biased. The current leakage will be low. Therefore, in both of the ON-state and OFF-state, the DC current is low from the node G control. The current consumption of the switch is low. Usually, the negative supply is generated by a low-driving capability charge pump with low clock rate to save current (e.g., smaller than 10 microamps (μA) of DC current consumption). The low DC current keeps the charge pump output at a negative voltage level. The switch controller (e.g., controller 1010 FIG. 10) can contain a level-shifter to shift the logic controls from single-rail to dual-rail to control the switch 1100. High DC current from the charge pump (CP) can lift the CP output negative voltage level up, which results in malfunctional level shifter and malfunctional control logic being implemented. The level shifter and control logic in those embodiments and situations are supplied by the CP output negative voltage.

Figure 12A:
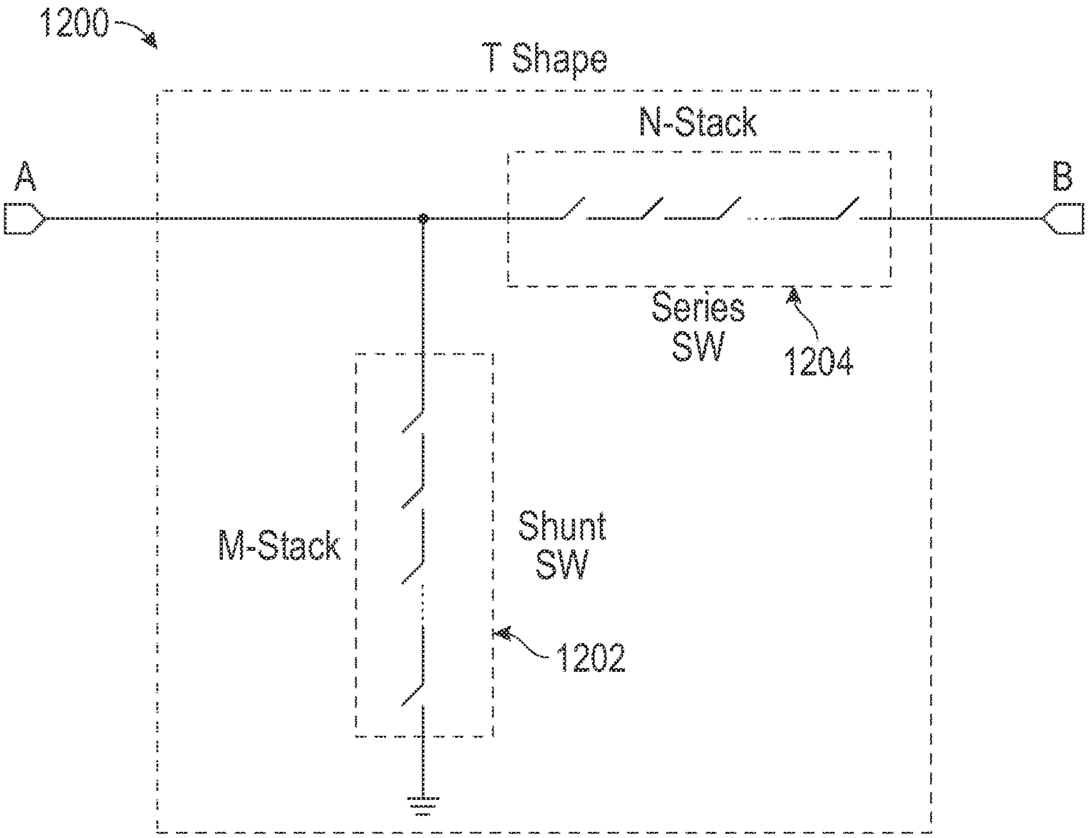
FIG. 12A illustrates a first switch configuration according to some aspects.
Figure 12B:
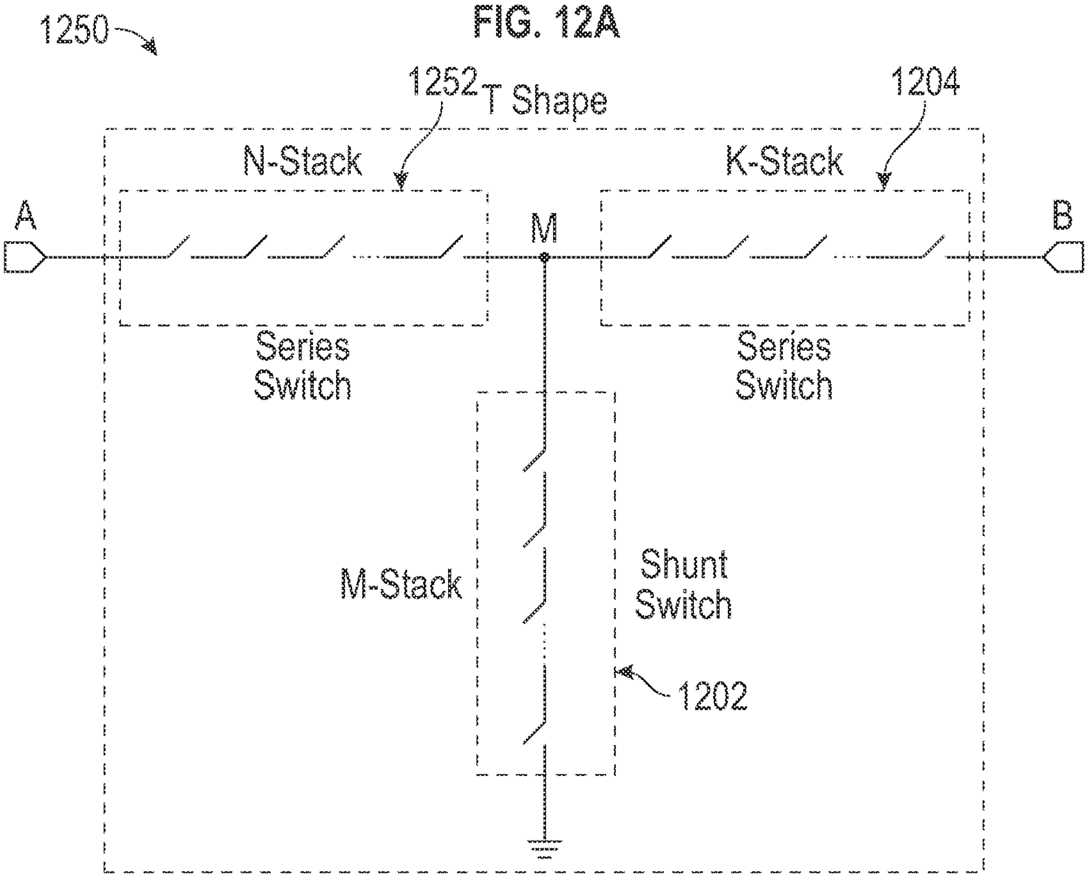
FIG. 12B illustrates a second switch configuration according to some aspects.
Figure 12C:
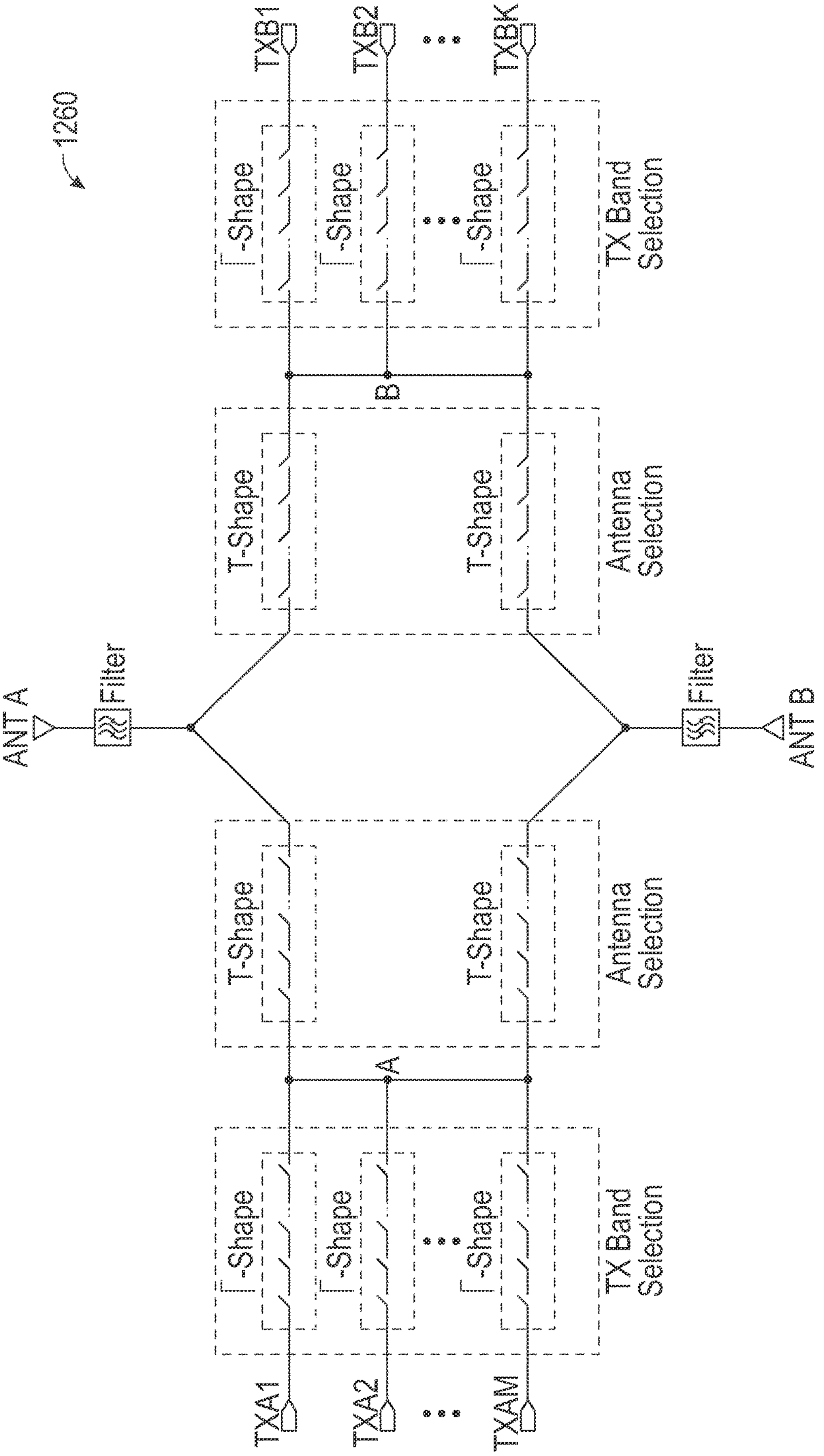
FIG. 12C illustrates an example configuration of a transmitter switch according to some aspects.

The N-stack switch 1100 can be used to design various configurations of switch. FIG. 12A illustrates a first switch configuration 1200 and FIG. 12B illustrates a second switch configuration 1250 according to some aspects. FIG. 12C illustrates an example configuration of a transmitter switch according to some aspects.

Figure 14:
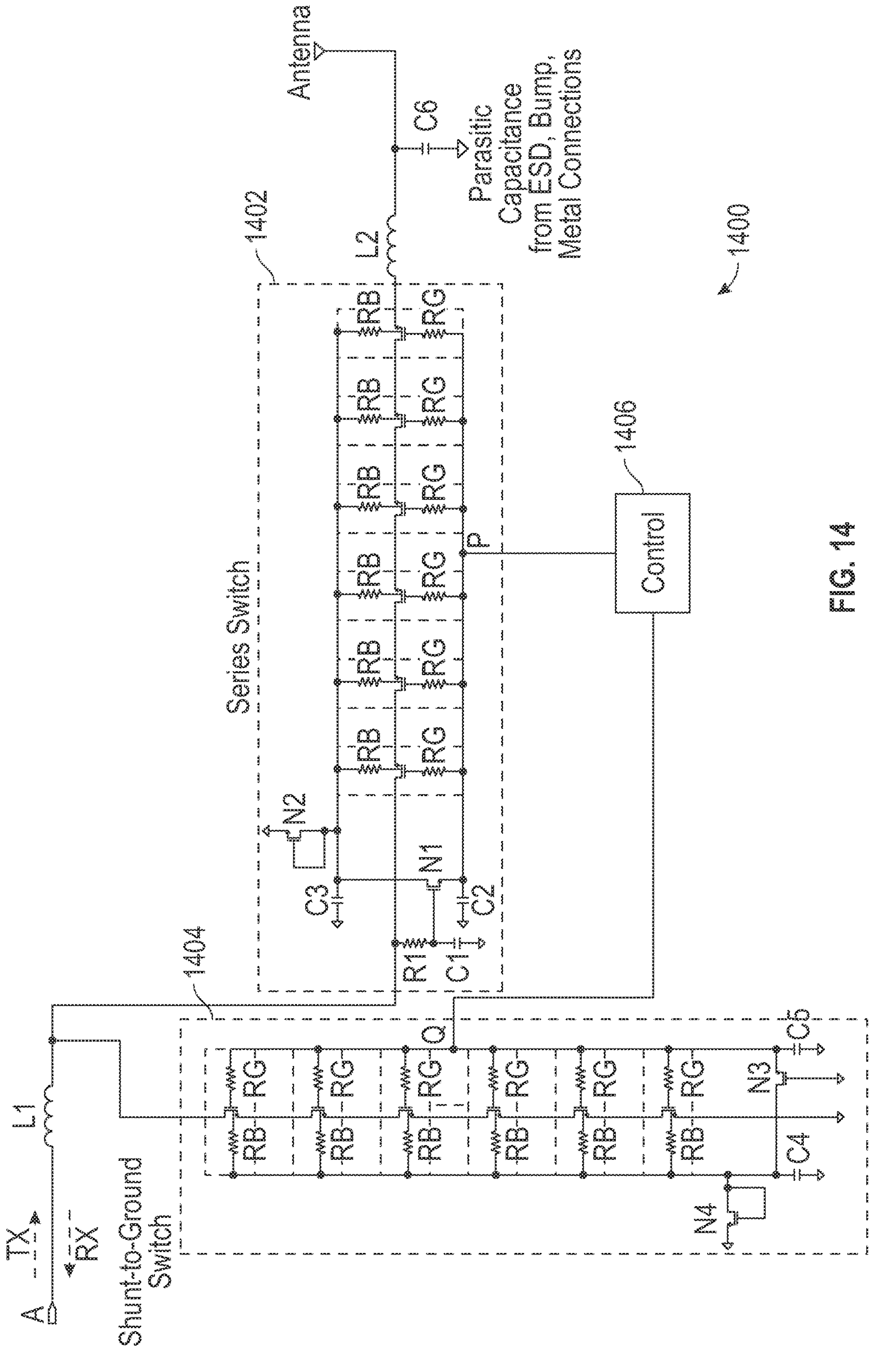
FIG. 14 illustrates a schematic diagram for a r-shape stacked switch according to some aspects.

In FIG. 12A, a r-shape switch 1200 is illustrated. The r-shaped switch 1200 can comprise a shunt-to-ground stacked switch 1202 and a series stacked switch 1204. Further details will be provided later herein with reference to FIG. 14. In an ON-state, the series switch is on and pass the signal between A and B with low impedance between A and B. The shunt-to-ground switch is off to isolate the signal to ground. In an OFF-state, the series switch is off and isolate the signal between A and B with high impedance between A and B. The shunt-to-ground switch is on to further attenuate the signals to improve the isolation. Referring briefly to FIG. 14, the NMOS devices in both of the series switch and shunt switch have a plurality of fingers. Fingers in this context refers to a general physical parameter of the NMOS device. Fingers can comprise poly-gate fingers in an NMOS layout. Each poly-gate can correspond to one NMOS device. For example, the finger number can correspond to the number of NMOS devices placed in parallel, and each finger can have a gate width of about 1.635 um, and gate length of about 162 nm. C6 is a load capacitance representing about 35 fF of bump capacitance and about 120 fF of ESD capacitance. Matching inductive elements L1 and L2 can have inductance values of about 100 pH and 200 pH, respectively, and the Q for L1 and L2 can be about 25 and 22. The VHIGH_Positive can be about 1.5 V and VLOW_Negative can be about −1.5 V, which meets the reliability requirements for the low DC current NMOS applications.

Referring now to FIG. 12B, the T-shape switch 1250 can include a second series switch 1252, relative to the r-shape switch 1200. The T-shape switch 1250 can isolate the input from the M node, which shunts to ground in an OFF-state. The input signal can be steered to another output switch without being tied to ground. The T-shape switch 1250 can have the same input signal fan out to multiple output antennas with one of the fan out switches in an ON-state and fan out switches in an OFF-state.

FIG. 12C illustrates an example configuration of a transmitter switch 1260 according to some aspects. The band selections switch coupled one of the TX bands from left TX paths to the node A, similarly, one of the TX bands from the right TX paths to the node B. The antenna selection switch coupled the TX signal from node A to one of the antenna A or B, and coupled the TX signal from node B to another one of the antenna A or B.

Figure 13A:
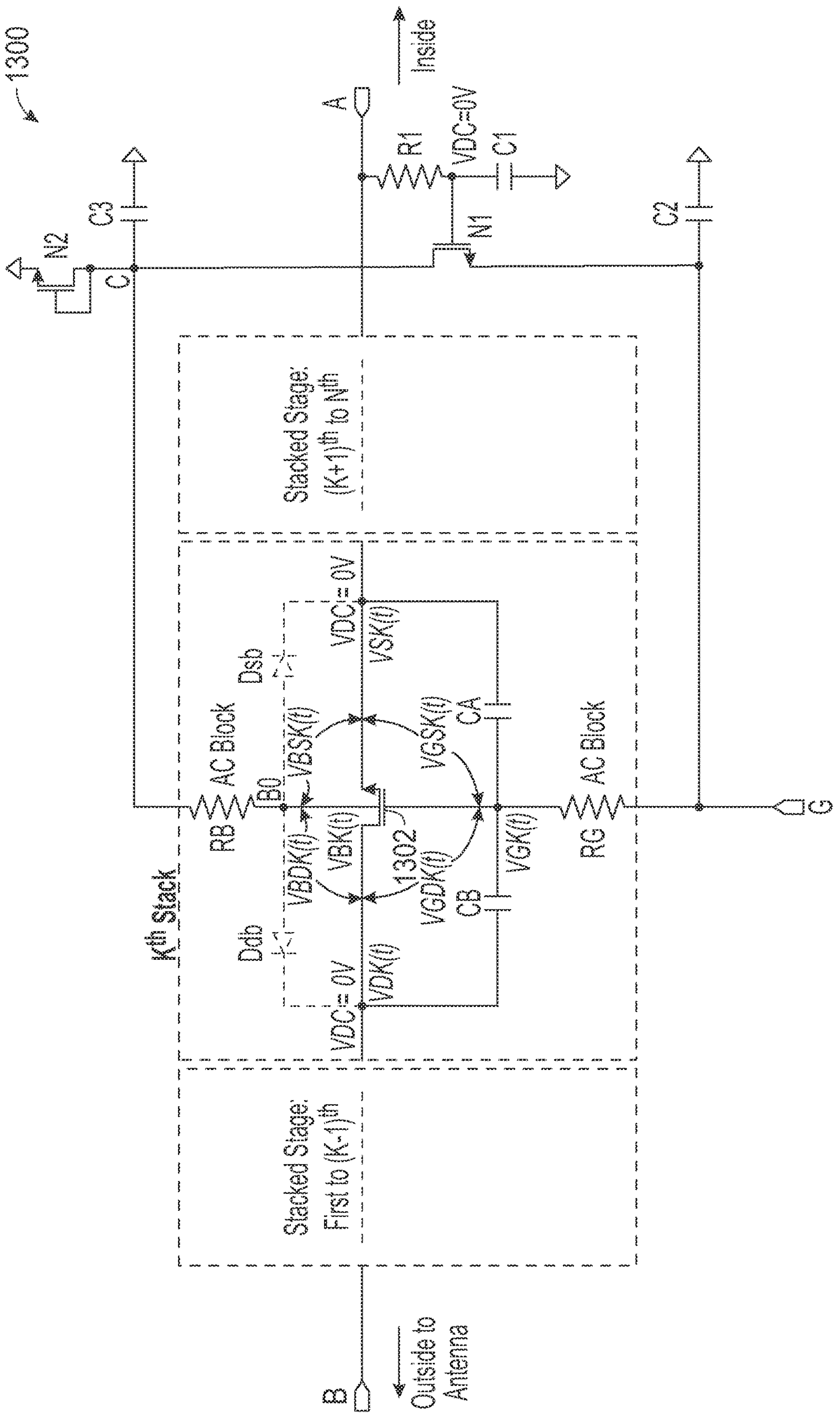
FIG. 13A illustrates a portion of a switch cell according to some aspects.

FIG. 13A illustrates a portion 1300 of a switch cell according to some aspects. A switch cell can include k−1 identical or nearly identical units between the terminal B and the $k^{th}$ unit, and N−k identical or nearly identical units between the $k^{th}$ unit and the terminal A. There can be a total of N units between node A and node B. The body common bias at node C can be generated by the bias circuitry comprised of N1, N3, R1, C1, C2 and C3. Ddb can comprise a parasitic p-n junction diode and can be coupled to a drain terminal and body terminal of the NMOS 1302 (e.g., $k^{th}$ unit NMOS). Dsb can comprise a parasitic p-n junction diode and can be coupled to a source terminal and body terminal of the NMOS 1302. CA can comprise a parasitic capacitance and can be coupled to a drain terminal and gate terminal of the NMOS 1302. CB can comprise a parasitic capacitance and can be coupled to a source terminal and gate terminal of the NMOS 1302. RG and RB can comprise resistive elements to block the AC signals from gate and body of NMOS 1302.

VDK(t) represents the transient waveform at the $k^{th}$ unit NMOS drain terminal. VBK(t) represents the transient waveform at the $k^{th}$ unit NMOS body terminal, which can be coupled to the common body DC bias node C by the resistive element RB. VGK(t) represents the transient waveform at the kth unit NMOS gate terminal, which can be coupled to the common gate DC bias node G by the resistive element RB. VSK(t) represents the transient waveform at the $k^{th}$ unit NMOS source terminal, which can be coupled to the common gate DC bias node G by the resistive element RB. VGDK(t) represents the transient waveform across the gate terminal and the drain terminal of the NMOS in the $k^{th}$ unit. VGSK(t) represents the transient waveform across the gate terminal and the source terminal of the NMOS in the $k^{th}$ unit. VBDK(t) represents the transient waveform across the body terminal and the drain terminal of the NMOS in the $k^{th}$ unit. VBSK(t) represents the transient waveform across the body terminal and the source terminal of the NMOS in the $k^{th}$ unit.

Figure 13B:
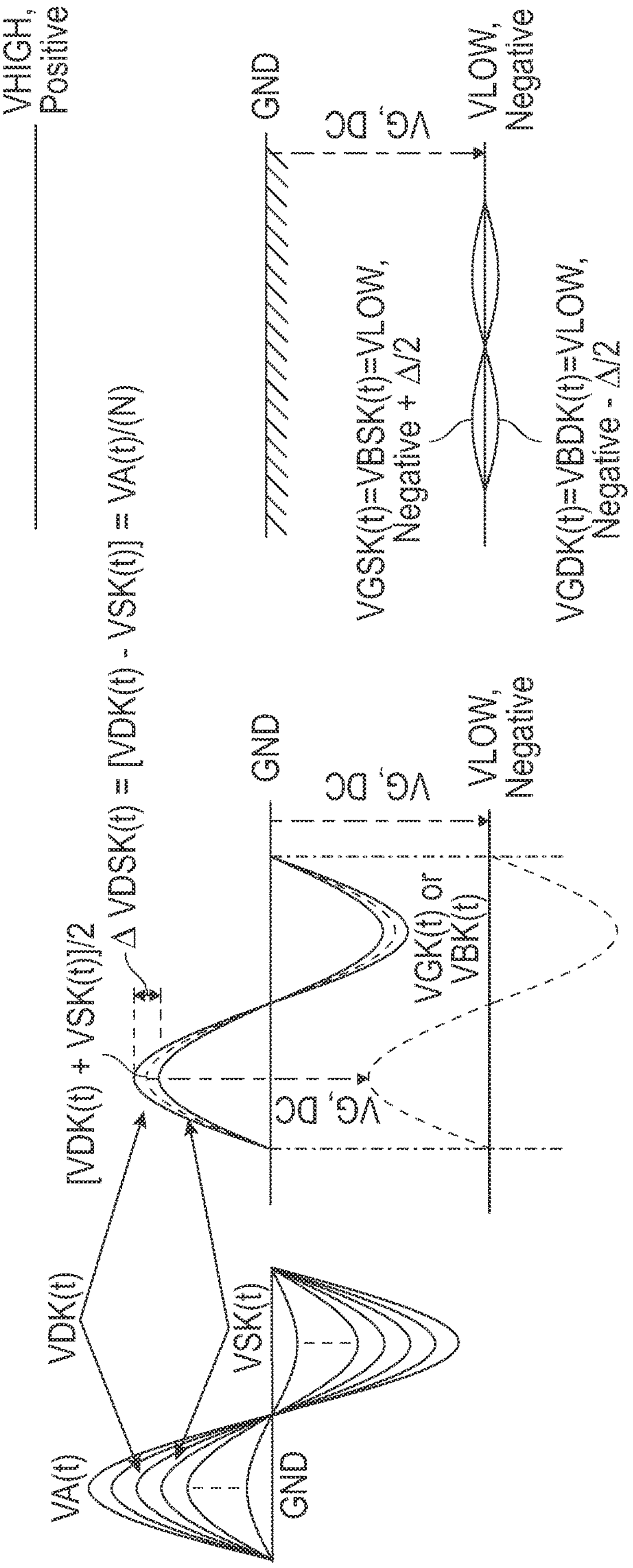
FIG. 13B illustrates transient waveforms for an OFF-state shunt-to-ground switch according to some aspects.

FIG. 13B illustrates transient waveforms for an OFF-state shunt-to-ground switch 1202 (FIGS. 12A and 12B) according to some aspects. The terminal A is coupled to the signal and the terminal B is coupled to ground and the switch 1202 shunts the signal to ground in ON-state and isolates the signal from ground in OFF-state. FIG. 13B depicts the OFF-state waveform. The left waveforms illustrate the voltage applied at the drain terminals of the NMOS at all the units (from first to the $N^{th}$ NMOS). The first NMOS drain terminal is the node A. The source terminal of the $(k-1)^{th}$ NMOS coupled to the drain terminal of the $k^{th}$ NMOS. The source terminal of the Nth NMOS is coupled to ground. The signal applied at node-A equally divided by the N stacked switch units.

The middle graph shows the $k^{th}$ unit NMOS drain terminal signal VDK(t) and the VSK(t), which is the $(k+1)^{th}$ unit NMOS drain terminal (coupled to the source terminal of the $k^{th}$ unit NMOS). The AC signal of the gate terminal of the $k^{th}$ unit NMOS is shows as the dash line in-between the VDK(t) and VSK(t), which is coupled by the CA and CB (Here, it is assumed that CA=CB). The DC offset of the gate is set to be VLOW_Negative in the OFF-state. The transient signal of the gate terminal (AC plus DC offset) is shows in the middle graph bottom dash line, named as VGK(t). Similarly, the VBK(t) can be the same as VGK(t).

The right graph shows the $k^{th}$ unit NMOS cross voltage VGDK(t), which is the voltage applied cross the gate terminal and drain terminal. VGSK(t) is the transient waveform cross gate terminal and source terminal of the NMOS in the $k^{th}$ unit. VBDK(t) is the transient waveform cross body terminal and drain terminal of the NMOS in the $k^{th}$ unit, and VBSK(t) is the transient waveform cross body terminal and source terminal of the NMOS in the $k^{th}$ unit. The signal applied at node A is divided equally by the N units. The AC swing cross the $k^{th}$ unit (between the drain and source) is:

$$VDSK(t)=[VDK(t)-VSK(t)]=VA(t)/(2N)$$

where VA(t) is the signal applied at node A. The node B is tied to ground.

The AC signal of gate or body of the NMOS are the middle of VDK(t) and VSK(t):

$$VGK,AC(t)=VBK,AC(t)=[VDK(t)+VSK(t)]/2$$

The DC signal of gate or body of the NMOS for OFF-state is VLOW_Negative, therefore, the transient signal of gate and body of the NMOS are:

$$VGK(t)=VGK,AC(t)+V\mathrm{LOW\_Negative}=[VDK(t)+VSK(t)]/2+V\mathrm{LOW\_Negative}$$

$$VBK(t)=VBK,AC(t)+V\mathrm{LOW\_Negative}=[VDK(t)+VSK(t)]/2+V\mathrm{LOW\_Negative}$$

The transient signal cross the gate terminal and drain terminal (DC+AC) is:

$$VGDK(t)=VGK(t)-VDK(t)=[VSK(t)-VDK(t)]/2+V\mathrm{LOW\_Negative}=-VA(t)/(2N)+V\mathrm{LOW\_Negative}$$

The transient signal cross the gate terminal and source terminal (DC+AC) is:

$$VGSK(t)=VGK(t)-VSK(t)=[VDK(t)-VSK(t)]/2+V\mathrm{LOW\_Negative}=VA(t)/(2N)+V\mathrm{LOW\_Negative}$$

The transient signal cross the body terminal and drain terminal (DC+AC) is:

$$VBDK(t)=VBK(t)-VDK(t)=[VSK(t)-VDK(t)]/2+V\mathrm{LOW\_Negative}=-VA(t)/(2N)+V\mathrm{LOW\_Negative}$$

The transient signal cross the body terminal and source terminal (DC+AC) is:

$$VBSK(t)=VBK(t)-VSK(t)=[VDK(t)-VSK(t)]/2+V\mathrm{LOW\_Negative}=VA(t)/(2N)+V\mathrm{LOW\_Negative}$$

The above signals cross as shown in the right graph.

Figure 13C:
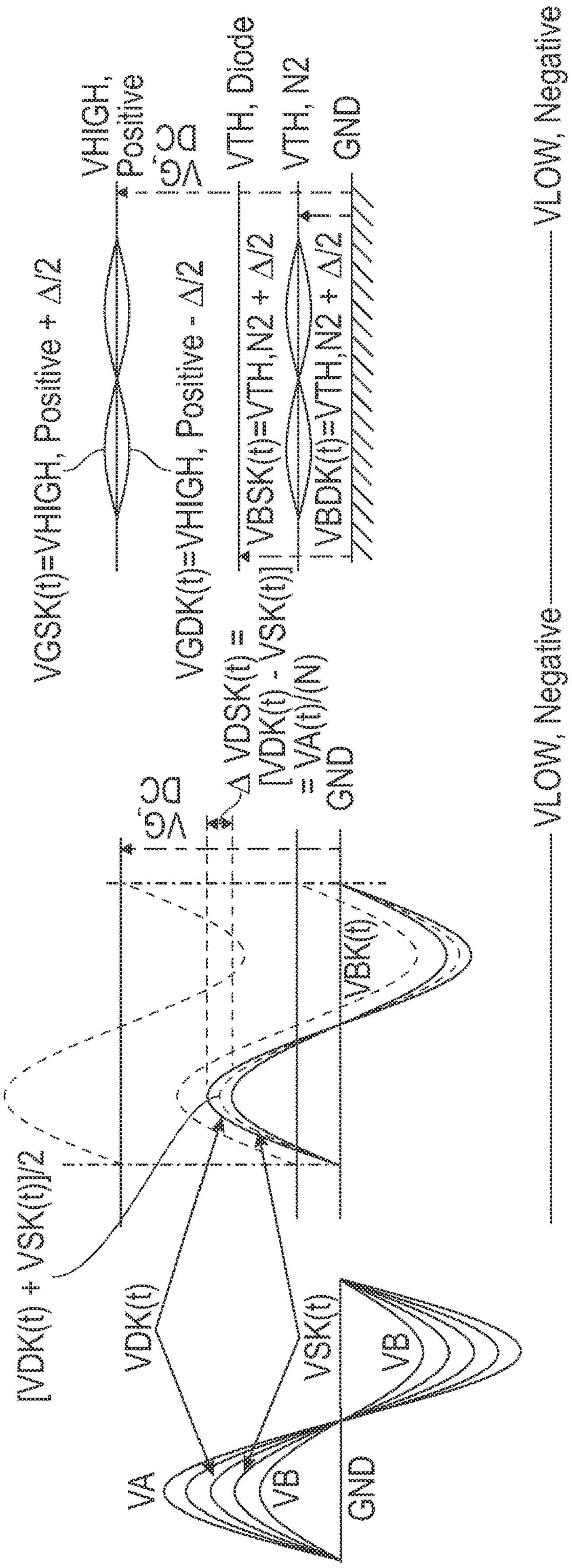
FIG. 13C illustrates transient waveforms for an ON-state in-series switch according to some aspects.

FIG. 13C illustrates transient waveforms for an ON-state in-series switch according to some aspects. In transmitter circuitry, terminal A can coupled to the input signal and the terminal B can be coupled to an output node connected to an antenna (a filter and matching network may be included between the output node and the antenna). In aspects involving a receiver, the terminal B can be coupled to an output node connected to an antenna (similarly, a filter and matching network can be included) to receive the signal, and terminal A is the output terminal. In the ON-state, the in-series switch can pass the signal from terminal A to B in the transmit case or pass from terminal B to terminal A for a receiver case. In the OFF state, the in-series switch can isolate the signal from the two terminals A and B. In FIG. 13C, the ON-state waveforms are illustrated. The left waveforms depict the voltage applied at the drain terminals of the NMOS at all the units (from first to the $N^{th}$ NMOS). In the case of a transmitter, the first NMOS drain terminal is node A. The source terminal of the $(k-1)^{th}$ NMOS is coupled to the drain terminal of the $k^{th}$ NMOS. The source terminal of the $N^{th}$ NMOS is coupled to terminal B. The signal applied at node A is equally divided by the N stacked switch units. It can be noted that the signal at node A is close the signal at node B in the ON-state. The attenuation ratio between A and B is the insertion loss, which is usually in the range of 1 DB to 2 DB.

The middle graph shows the $k^{th}$ unit NMOS drain terminal signal VDK(t) and VSK(t), which is the $(k+1)^{th}$ unit NMOS drain terminal (coupled to the source terminal of the $k^{th}$ unit NMOS). The AC signal of the gate terminal of the $k^{th}$ unit NMOS is shown as the dash line in-between the VDK(t) and VSK(t), which is coupled by CA and CB (Here, it is assumed that CA=CB). The DC offset of the gate is set to be VHIGH Positive in ON-state. The transient signal of the gate terminal (AC plus DC offset) is shows in the middle graph, labeled VGK(t). The body transient waveform is the VBK(t) in the middle graph.

The right graph depicts the kth unit NMOS cross voltage VGDK(t), which is the voltage applied cross the gate terminal and drain terminal. VGSK(t) is the transient waveform cross gate terminal and source terminal of the NMOS in the $k^{th}$ unit. VBDK(t) is the transient waveform cross body terminal and drain terminal of the NMOS in the $k^{th}$ unit, and VBSK(t) is the transient waveform cross body terminal and source terminal of the NMOS in the $k^{th}$ unit. The signal applied at node A is divided equally by the N units. The AC swing across the $k^{th}$ unit (between the drain and source) is:

$$VDSK(t)=[VDK(t)-VSK(t)]=(VA(t)-VB(t))/(2N)$$

where the VA(t) is the signal applied at node A. The VB(t) is the signal at node B. If considering the insertion loss in DB is ILDB, then, $$VB(t) = \lambda VA(t) \text{ and } \lambda = 10^{\frac{ILDB}{20}}$$

$$VDSK(t)=(1-\lambda)VA(t)/(2N)$$

For example, if the insertion loss is 2 dB, then the VDSK(k)=0.21VA(t)/(N). With N=12 (stack), and VA, peak=17.78 V (average power is 35 dBm), the VDSK, peak=0.3115V.

The AC signal of gate or body of the NMOS are the middle of VDK(t) and VSK(t):

$$VGK{,}AC(t)=VBK{,}AC(t)=[VDK(t)+VSK(t)]/2$$

The DC signal of gate of NMOS for ON-state is VHIGH_Positive, therefore, the transient signal of gate of the NMOS are:

$$VGK(t)=VGK{,}AC(t)+\text{VHIGH\_Positive}=[VDK(t)+VSK(t)]/2+\text{VHIGH\_Positive}$$

The DC signal of body of NMOS for ON-state is VTH, therefore, the transient signal of body of the NMOS are:

$$VBK(t)=VBK{,}AC(t)+VTH=[VDK(t)+VSK(t)]/2+VTH$$

The transient signal cross the gate terminal and drain terminal (DC+AC) is:

$$VGDK(t)=VGK(t)-VDK(t)=[VSK(t)-VDK(t)]/2+\text{VLOW\_Negative}=-\lambda VA(t)/(2N)+\text{VHIGH\_Positive}$$

The transient signal cross the gate terminal and source terminal (DC+AC) is:

$$VGSK(t)=VGK(t)-VSK(t)=[VDK(t)-VSK(t)]/2+\text{VLOW\_Negative}=\lambda VA(t)/(2N)+\text{VHIGH\_Positive}$$

The transient signal cross the body terminal and drain terminal (DC+AC) is:

$$VBDK(t)=VBK(t)-VDK(t)=[VSK(t)-VDK(t)]/2+\text{VLOW\_Negative}=-\lambda VA(t)/(2N)+VTH$$

The transient signal cross the body terminal and source terminal (DC+AC) is:

$$VBSK(t)=VBK(t)-VSK(t)=[VDK(t)-VSK(t)]/2+\text{VLOW\_Negative}=\lambda VA(t)/(2N)+VTH$$

For example, if the insertion loss is 2 dB with N=12 (stack), and VA, peak=17.78 V (average power is 35 dBm), the maximum transient signal cross the body and drain is between −0.05575V and 0.256V for VTH=0.1 V. There may be nearly no current leakage for the parasitic diode Ddb. Similarly, there may be no current leakage for the parasitic diode Dsb.

All the signals cross between the gate, body, drain, and source as shown in the right graph.

FIG. 14 illustrates a schematic diagram for a r-shape stacked switch 1400 according to some aspects. The switch 1400 can comprise a multi-stack NMOS series switch 1402 and a multi-stack NMOS shunt-to-ground switch 1404. The control block 1406 can generate the control signals applied at the control inputs (node P and node Q) for both the series-switch 1402 and the shunt-to-ground switch 1404, according to Table 1:

| Signal Transfer State | Series Switch State | Shunt-to-Ground switch state | DC voltage at node P | DC voltage at node Q |
|---|---|---|---|---|
| ON | ON | OFF | VHIGH_Positive | VLOW_Negative |
| OFF | OFF | ON | VLOW_Negative | VHIGH_Positive |

The illustrated NMOS device has 200 fingers, each finger can have a gate width of about 1.635 μm, and gate length of about 162 nm. C6 can comprise a load capacitance representing 35 fF of bump capacitance and 120 fF of ESD capacitance. Matching inductive elements L1 and L2 can have inductances of about 100 pH and 200 pH, respectively. The Q for L1 and L2 can be about 25 and 22. The VHIGH_Positive can be about 1.5 V and VLOW,Negative can be about −1.5 V, which meets the reliability requirements for the low DC current NMOS applications.

Figure 15:
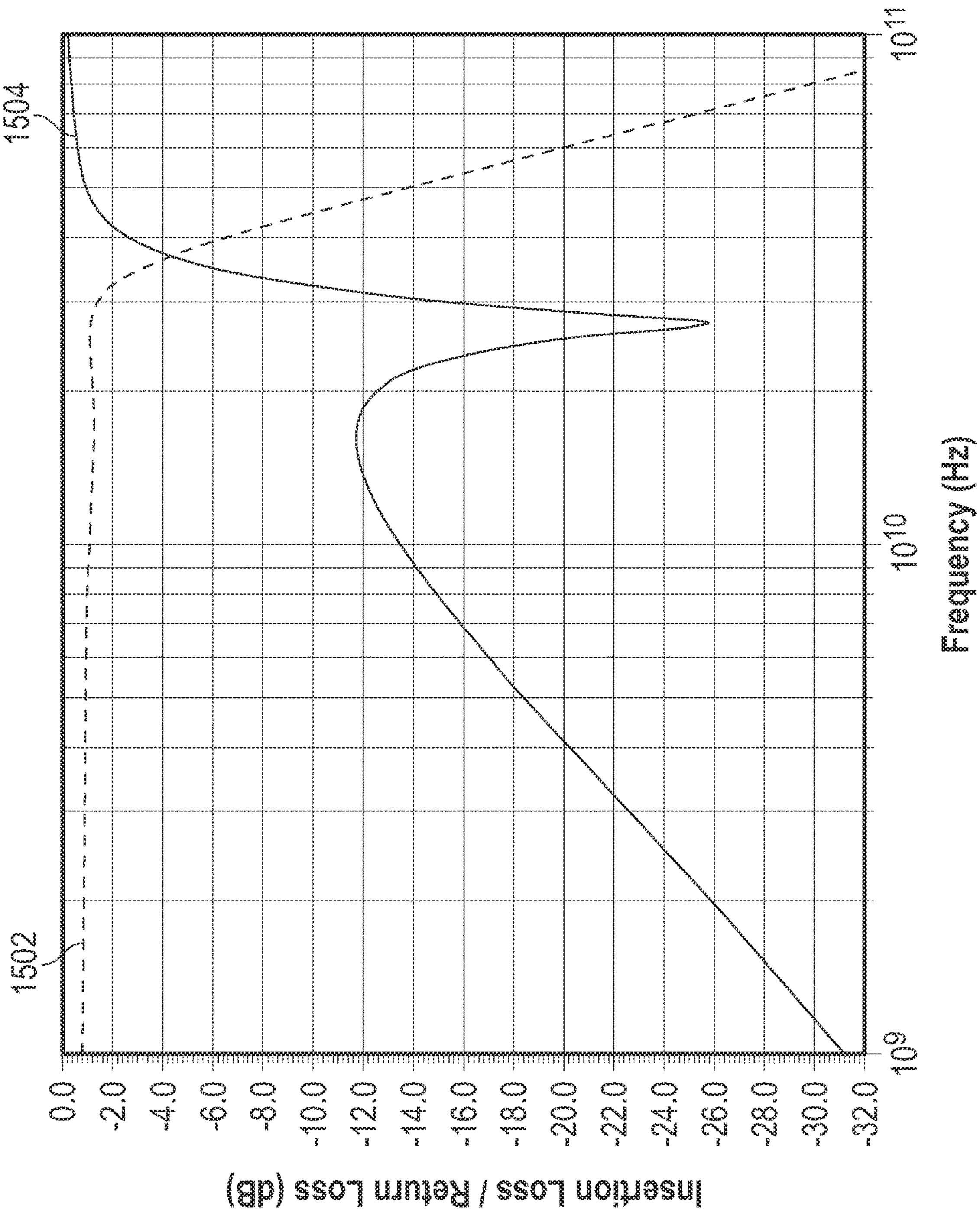
FIG. 15 illustrates insertion loss and return loss according to some aspects.

FIG. 15 illustrates insertion loss and return loss according to some aspects. Curve 1502 Insertion Loss of the r-shape switch. Curve 1504 illustrates return loss of the r-shape switch. The insertion loss 1502 can be better than −1.2 dB with the frequency below 30 GHz. Return loss 1504 can be better than −11.8 dB with the frequency below 30 GHz.

Figure 16:
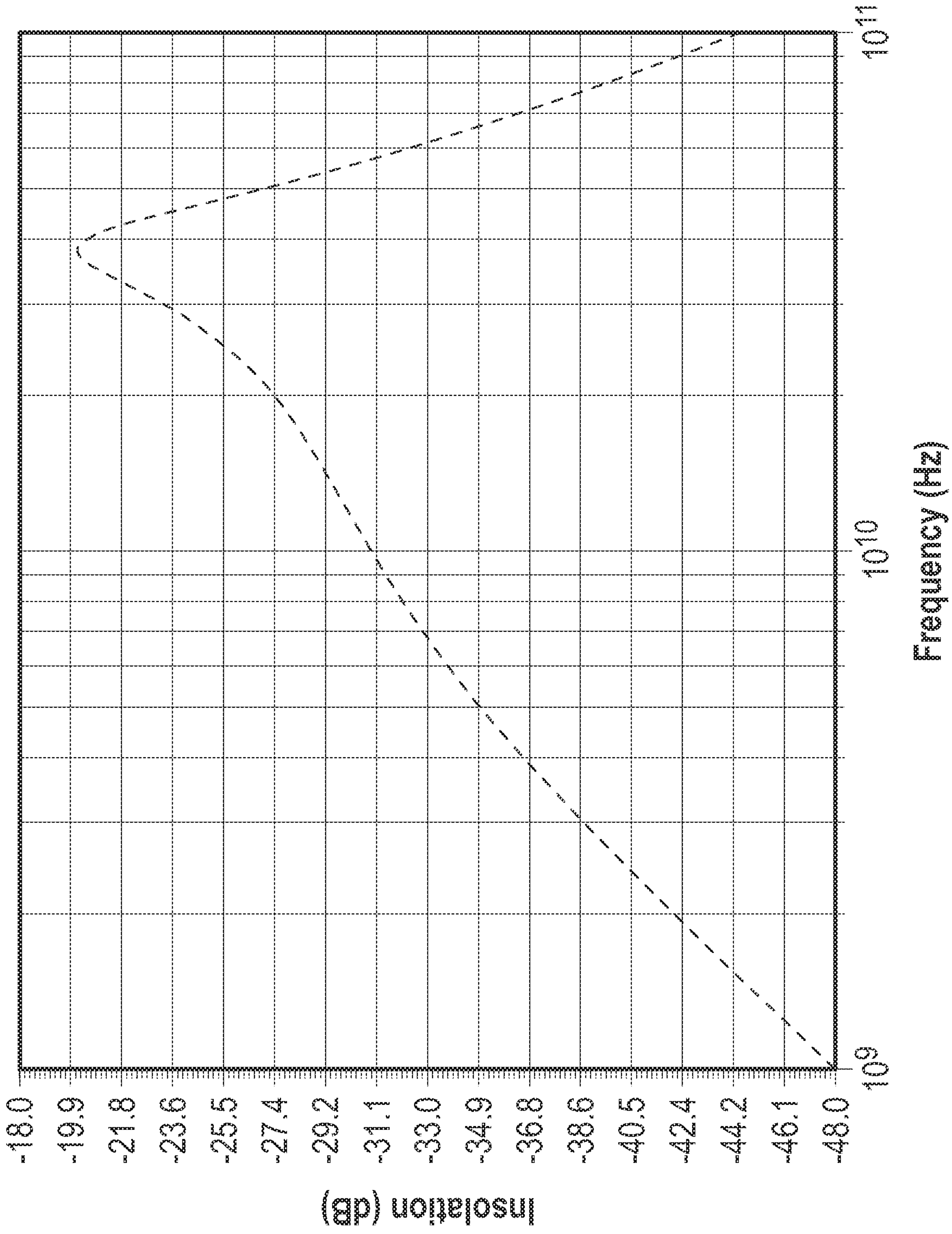
FIG. 16 illustrates isolation according to some aspects.

FIG. 16 illustrates isolation according to some aspects. Isolation is shown in dB for the r-shape switch.

Figure 17:
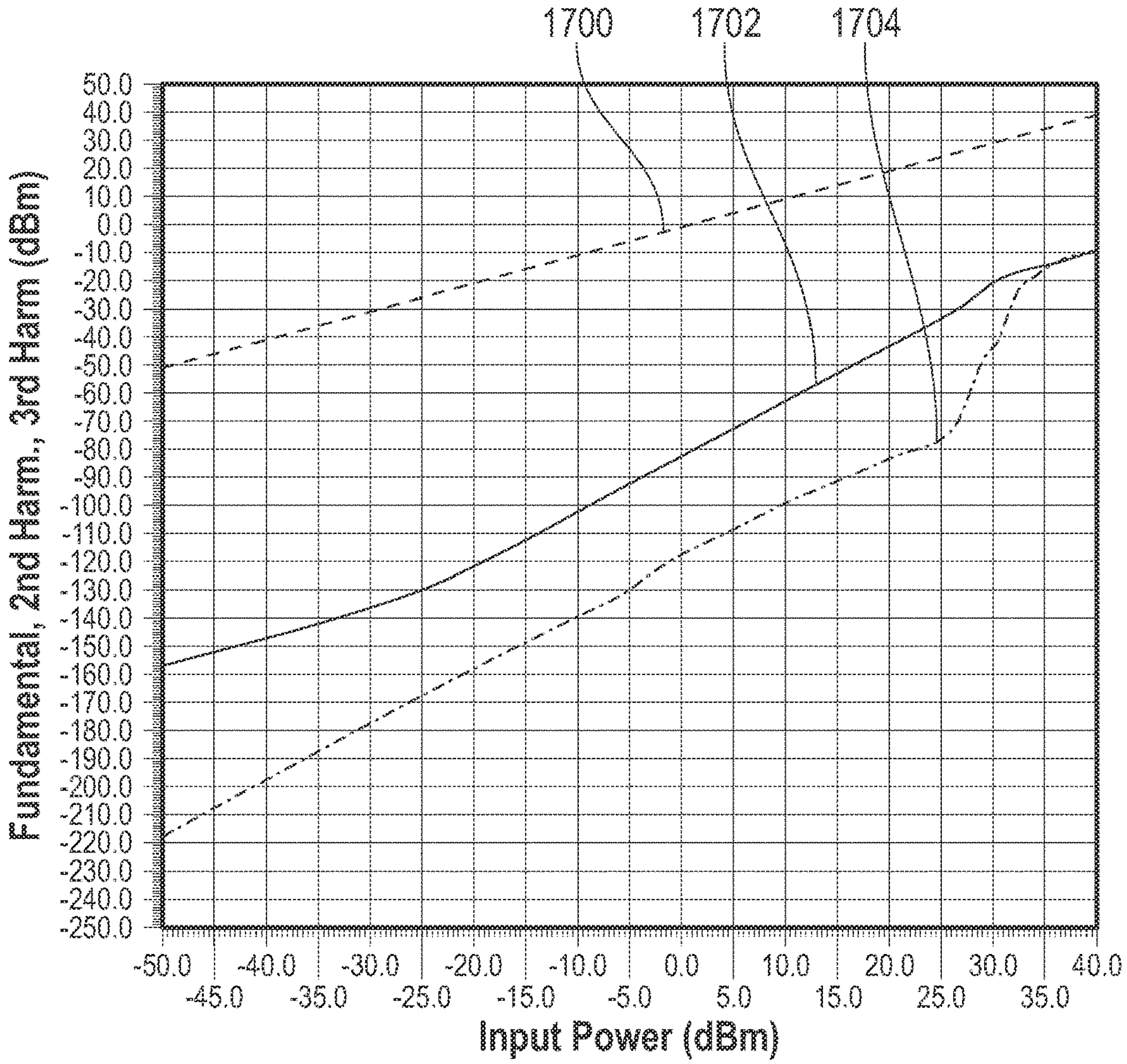
FIG. 17 illustrates output power versus input power and harmonics for the r-shape switch according to some aspects.

FIG. 17 illustrates output power versus input power and harmonics for the r-shape switch according to some aspects. Curve 1700 illustrates output power in dBm. Curve 1702 illustrates the second harmonic in dBm. Curve 1704 illustrates the third harmonic in dBm. As can be seen, linearity is acceptable up to 35 dBm. The 35 dBm point corresponds to the 17.78 V peak of sinusoidal waveform with 50 ohms as load. With a 12-stack switch for the shunt to ground switch, each unit drain-source cross voltage is around 17.78 V/12=1.48 V. The peak of AC swings for the voltage cross between gate and drain, gate and source, body and drain, body and source are around 1.48V/2=0.74 V.

Figure 18:
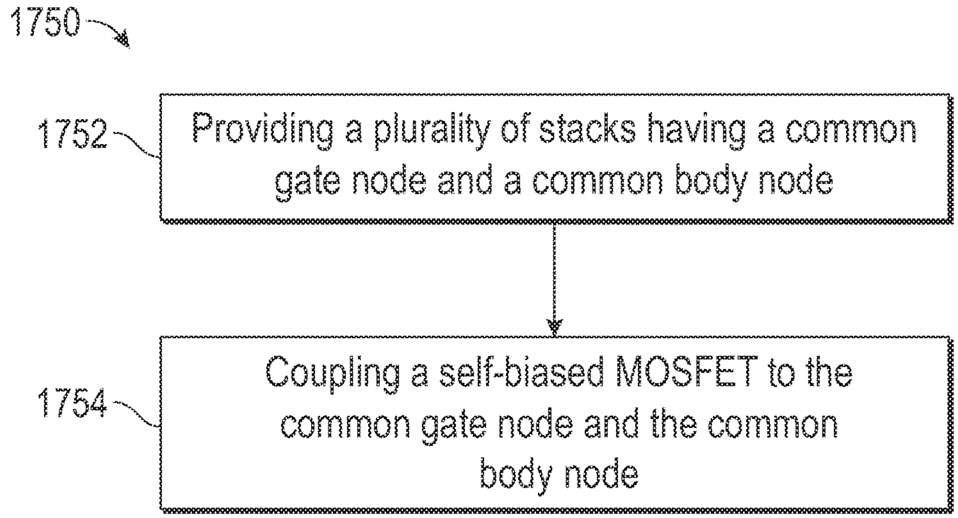
FIG. 18 illustrates a method for forming a switch according to some aspects.

FIG. 18 illustrates a method 1750 for forming a switch according to some aspects. The method 1750 can begin with operation 1752 by providing a plurality of stacks having a common gate node and a common body node. A stack of the plurality of stacks can include a MOSFET having a body resistive element coupled to a body terminal of the MOSFET and the common body node a gate resistive element coupled to a gate terminal of the MOSFET and the common gate node.

The method 1750 can continue with operation 1754 with coupling a self-biased MOSFET to the common gate node and the common body node. A gate of the self-biased MOSFET can be configured to receive DC bias with a low pass filter.

Other Systems and Apparatuses

Figure 19:
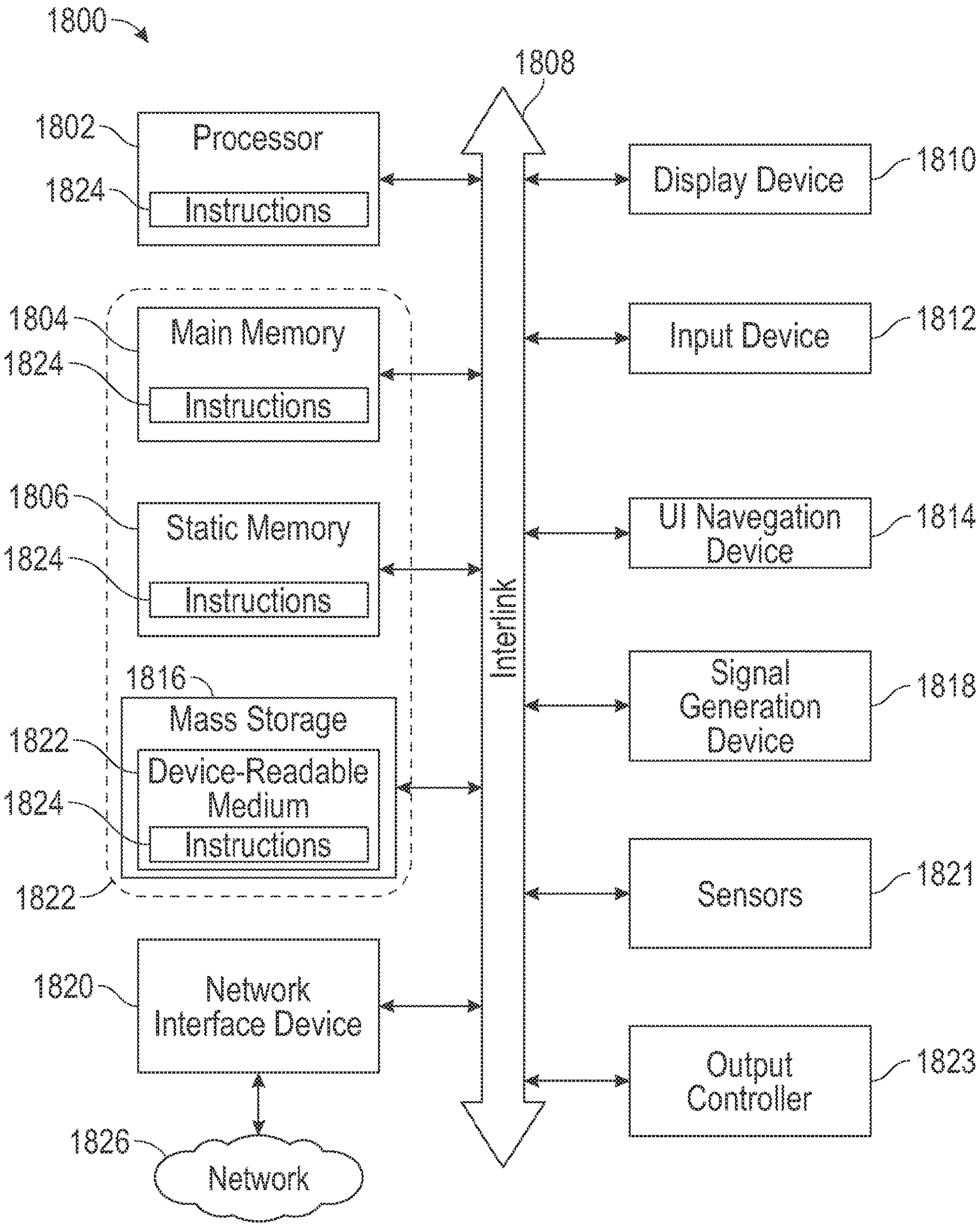
FIG. 19 illustrates a block diagram of a communication device such as an evolved Node-B (eNB), a new generation Node-B (gNB), an access point (AP), a wireless station (STA), a mobile station (MS), or a user equipment (UE), in accordance with some aspects.

FIG. 19 illustrates a block diagram of a communication device 1800 such as an evolved Node-B (eNB), a new generation Node-B (gNB), an access point (AP), a wireless station (STA), a mobile station (MS), or a user equipment (UE), in accordance with some aspects. In alternative aspects, the communication device 1800 may operate as a standalone device or may be connected (e.g., networked) to other communication devices. In some aspects, the communication device 1800 can use one or more of the techniques and circuits discussed herein, in connection with any of FIG. 1-FIG. 14.

Circuitry (e.g., processing circuitry) is a collection of circuits implemented in tangible entities of the device 1800 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation.

In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the device 1800 follow.

In some aspects, the device 1800 may operate as a standalone device or may be connected (e.g., networked) to other devices. In a networked deployment, the communication device 1800 may operate in the capacity of a server communication device, a client communication device, or both in server-client network environments. In an example, the communication device 1800 may act as a peer communication device in peer-to-peer (P2P) (or other distributed) network environment. The communication device 1800 may be a UE, eNB, PC, a tablet PC, a STB, a PDA, a mobile telephone, a smart phone, a web appliance, a network router, switch or bridge, or any communication device capable of executing instructions (sequential or otherwise) that specify actions to be taken by that communication device. Further, while only a single communication device is illustrated, the term "communication device" shall also be taken to include any collection of communication devices that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a communication device-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Communication device (e.g., UE) 1800 may include a hardware processor 1802 (e.g., a central processing unit (CPU), a graphics processing unit (GPU), a hardware processor core, or any combination thereof), a main memory 1804, a static memory 1806, and mass storage 1816 (e.g., hard drive, tape drive, flash storage, or other block or storage devices), some or all of which may communicate with each other via an interlink (e.g., bus) 1808.

The communication device 1800 may further include a display unit 1810, an alphanumeric input device 1812 (e.g., a keyboard), and a user interface (UI) navigation device 1814 (e.g., a mouse). In an example, the display unit 1810, input device 1812 and UI navigation device 1814 may be a touch screen display. The communication device 1800 may additionally include a signal generation device 1818 (e.g., a speaker), a network interface device 1820, and one or more sensors 1821, such as a global positioning system (GPS) sensor, compass, accelerometer, or another sensor. The communication device 1800 may include an output controller 1828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1816 may include a communication device-readable medium 1822, on which is stored one or more sets of data structures or instructions 1824 (e.g., software) embodying or utilized by any one or more of the techniques or functions described herein. In some aspects, registers of the processor 1802, the main memory 1804, the static memory 1806, and/or the mass storage 1816 may be, or include (completely or at least partially), the device-readable medium 1822, on which is stored the one or more sets of data structures or instructions 1824, embodying or utilized by any one or more of the techniques or functions described herein. In an example, one or any combination of the hardware processor 1802, the main memory 1804, the static memory 1806, or the mass storage 1816 may constitute the device-readable medium 1822.

As used herein, the term "device-readable medium" is interchangeable with "computer-readable medium" or "machine-readable medium". While the communication device-readable medium 1822 is illustrated as a single medium, the term "communication device-readable medium" may include a single medium or multiple media (e.g., a centralized or distributed database, and/or associated caches and servers) configured to store the one or more instructions 1824.

The term "communication device-readable medium" may include any medium that is capable of storing, encoding, or carrying instructions for execution by the communication device 1800 and that cause the communication device 1800 to perform any one or more of the techniques of the present disclosure, or that is capable of storing, encoding, or carrying data structures used by or associated with such instructions. Non-limiting communication device-readable medium examples may include solid-state memories, and optical and magnetic media. Specific examples of communication device-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, communication device-readable media may include non-transitory communication device-readable media. In some examples, communication device-readable media may include communication device-readable media that is not a transitory propagating signal.

The instructions 1824 may further be transmitted or received over a communications network 1826 using a transmission medium via the network interface device 1820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 1820 may include one or more physical jacks (e.g., Ethernet, coaxial, or phone jacks) or one or more antennas to connect to the communications network 1826. In an example, the network interface device 1820 may include a plurality of antennas to wirelessly communicate using at least one of single-input multiple-output (SIMO), MIMO, or multiple-input single-output (MISO) techniques. In some examples, the network interface device 1820 may wirelessly communicate using Multiple User MIMO techniques.

The term "transmission medium" shall be taken to include any intangible medium that is capable of storing, encoding, or carrying instructions for execution by the communication device 1800, and includes digital or analog communications signals or other intangible medium to facilitate communication of such software. In this regard, a transmission medium in the context of this disclosure is a device-readable medium.

Figure 20:
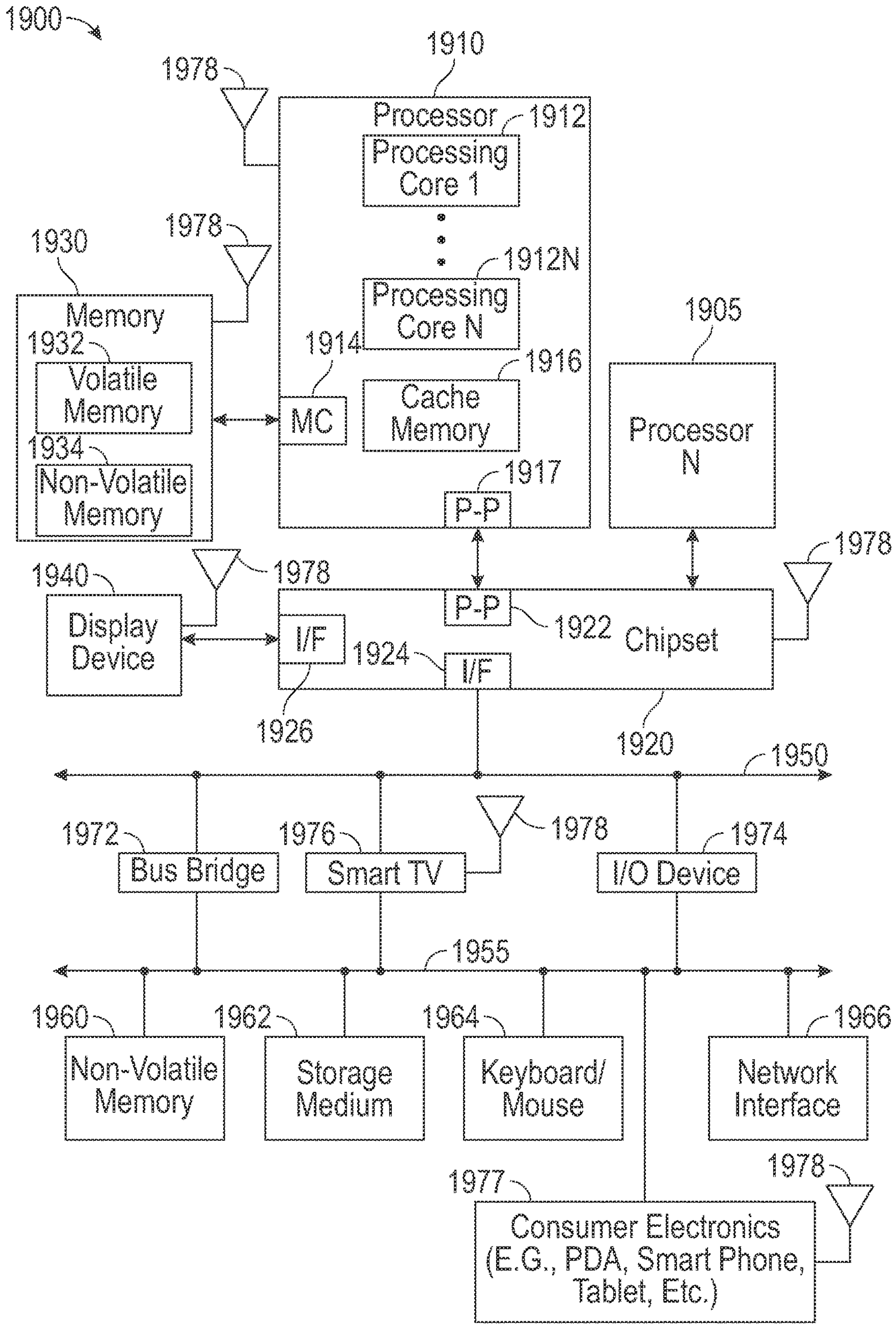
FIG. 20 illustrates a system level diagram, depicting an example of an electronic device (e.g., system) that can include, for example, a transmitter configured to selectively fan out a signal to one of multiple communication channels.

FIG. 20 illustrates a system level diagram, depicting an example of an electronic device (e.g., system) that can include, for example, a transmitter configured to selectively fan out a signal to one of multiple communication channels. FIG. 20 is included to show an example of a higher-level device application for the subject matter discussed above with regards to FIGS. 1-17. In one aspect, system 1900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some aspects, system 1900 is a system on a chip (SOC) system.

In one aspect, processor 1910 has one or more processor cores 1912, . . . , 1912N, where 1912N represents the Nth processor core inside processor 1910 where N is a positive integer. In one aspect, system 1900 includes multiple processors including 1910 and 1905, where processor 1905 has logic similar or identical to the logic of processor 1910. In some aspects, processing core 1912 includes, but is not limited to, pre-fetch logic to fetch instructions, decode logic to decode the instructions, execution logic to execute instructions and the like. In some aspects, processor 1910 has a cache memory 1916 to cache instructions and/or data for system 1900. Cache memory 1916 may be organized into a hierarchal structure including one or more levels of cache memory.

In some aspects, processor 1910 includes a memory controller 1914, which is operable to perform functions that enable the processor 1910 to access and communicate with memory 1930 that includes a volatile memory 1932 and/or a non-volatile memory 1934. In some aspects, processor 1910 is coupled with memory 1930 and chipset 1920. Processor 1910 may also be coupled to a wireless antenna 1978 to communicate with any device configured to transmit and/or receive wireless signals. In one aspect, an interface for wireless antenna 1978 operates in accordance with, but is not limited to, the IEEE 802.11 standard and its related family, Home Plug AV (HPAV), Ultra Wide Band (UWB), Bluetooth, WiMax, or any form of wireless communication protocol.

In some aspects, volatile memory 1932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1934 includes, but is not limited to, flash memory, phase change memory (PCM), read-only memory (ROM), electrically erasable programmable read-only memory (EEPROM), or any other type of non-volatile memory device.

Memory 1930 stores information and instructions to be executed by processor 1910. In one aspect, memory 1930 may also store temporary variables or other intermediate information while processor 1910 is executing instructions. In the illustrated aspect, chipset 1920 connects with processor 1910 via Point-to-Point (PtP or P-P) interfaces 1917 and 1922. Chipset 1920 enables processor 1910 to connect to other elements in system 1900. In some aspects of the example system, interfaces 1917 and 1922 operate in accordance with a PtP communication protocol such as the Intel® QuickPath Interconnect (QPI) or the like. In other aspects, a different interconnect may be used.

In some aspects, chipset 1920 is operable to communicate with processor 1910, 1905N, display device 1940, and other devices, including a bus bridge 1972, a smart TV 1976, I/O devices 1974, nonvolatile memory 1960, a storage medium (such as one or more mass storage devices) 1962, a keyboard/mouse 1964, a network interface 1966, and various forms of consumer electronics 1977 (such as a PDA, smart phone, tablet etc.), etc. In one aspect, chipset 1920 couples with these devices through an interface 1924. Chipset 1920 may also be coupled to a wireless antenna 1978 to communicate with any device configured to transmit and/or receive wireless signals.

Chipset 1920 connects to display device 1940 via interface 1926. Display device 1940 may be, for example, a liquid crystal display (LCD), a plasma display, cathode ray tube (CRT) display, or any other form of visual display device. In some aspects of the example system, processor 1910 and chipset 1920 are merged into a single SOC. In addition, chipset 1920 connects to one or more buses 1950 and 1955 that interconnect various system elements, such as I/O devices 1974, nonvolatile memory 1960, storage medium 1962, a keyboard/mouse 1964, and network interface 1966. Buses 1950 and 1955 may be interconnected together via a bus bridge 1972.

In one aspect, mass storage device 1962 includes, but is not limited to, a solid-state drive, a hard disk drive, a universal serial bus flash memory drive, or any other form of computer data storage medium. In one aspect, network interface 1966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one aspect, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 16 are depicted as separate blocks within the system 1900, the functions performed by some of these blocks may be integrated within a single semiconductor circuit or may be implemented using two or more separate integrated circuits. For example, although cache memory 1916 is depicted as a separate block within processor 1910, cache memory 1916 (or selected aspects of 1916) can be incorporated into processor core 1912.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one aspect", "an aspect", "an example aspect", "some aspects", "demonstrative aspect", "various aspects" etc., indicate that the aspect(s) so described may include a particular feature, structure, or characteristic, but not every aspect necessarily includes the particular feature, structure, or characteristic. Further, repeated use of the phrase "in one aspect" does not necessarily refer to the same aspect, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some aspects may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a sensor device, an Internet of Things (IoT) device, a wearable device, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some aspects may, for example, be used in conjunction with devices and/or networks operating in accordance with existing IEEE 802.11 standards (including IEEE 802.11-2016 (IEEE 802.11-2016, IEEE Standard for Information technology—Telecommunications and information exchange between systems Local and metropolitan area networks-Specific requirements Part 11: Wireless LAN Medium Access Control (MAC) and Physical Layer (PHY) Specifications, Dec. 7, 2016); IEEE 802.11ay (P802.11ay Standard for Information Technology—Telecommunications and Information Exchange Between Systems Local and Metropolitan Area Networks-Specific Requirements Part 11: Wireless LAN Medium Access Control (MAC) and Physical Layer (PHY) Specifications—Amendment: Enhanced Throughput for Operation in License-Exempt Bands Above 45 GHz)) and/or future versions and/or derivatives thereof, devices and/or networks operating in accordance with existing WiFi Alliance (WFA) Peer-to-Peer (P2P) specifications (including WiFi P2P technical specification, version 1.5, Aug. 4, 2015) and/or future versions and/or derivatives thereof, devices and/or networks operating in accordance with existing Wireless-Gigabit-Alliance (WGA) specifications (including Wireless Gigabit Alliance, Inc WiGig MAC and PHY Specification Version 1.1, April 2011, Final specification) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some aspects may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some aspects may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), FDM Time-Division Multiplexing (TDM), Time-Division Multiple Access (TDMA), Multi-User MIMO (MU-MIMO), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other aspects may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative aspects, a wireless device may be or may include a peripheral that is integrated with a computer, or a peripheral that is attached to a computer. In some demonstrative aspects, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting and/or the action of receiving. In one example, the phrase "communicating a signal" may refer to the action of transmitting the signal by a first device and may not necessarily include the action of receiving the signal by a second device. In another example, the phrase "communicating a signal" may refer to the action of receiving the signal by a first device, and may not necessarily include the action of transmitting the signal by a second device.

Some demonstrative aspects may be used in conjunction with a wireless communication network communicating over a frequency band above 45 Gigahertz (GHz), e.g., 60 GHz. However, other aspects may be implemented utilizing any other suitable wireless communication frequency bands, for example, an Extremely High Frequency (EHF) band (the millimeter wave (mmWave) frequency band), e.g., a frequency band within the frequency band of between 20 GHz and 300 GHz, a frequency band above 45 GHz, a frequency band below 20 GHz, e.g., a Sub 1 GHz (SIG) band, a 2.4 GHz band, a 5 GHz band, a WLAN frequency band, a WPAN frequency band, a frequency band according to the WGA specification, and the like.

As used herein, the term "circuitry" may, for example, refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some aspects, circuitry may include logic, at least partially operable in hardware. In some aspects, the circuitry may be implemented as part of and/or in the form of a radio virtual machine (RVM), for example, as part of a Radio processor (RP) configured to execute code to configured one or more operations and/or functionalities of one or more radio components.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The term "antenna" or "antenna array", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

ADDITIONAL NOTES AND ASPECTS

Example 1 is switch circuitry, comprising: a plurality of stacks having a common gate node and a common body node, wherein a stack of the plurality of stacks includes a metal-oxide-semiconductor field-effect transistor (MOSFET) having a body resistive element coupled to a body terminal of the MOSFET and the common body node a gate resistive element coupled to a gate terminal of the MOSFET and the common gate node; and a self-biased MOSFET coupled to the common gate node and the common body node, a gate of the self-biased MOSFET configured to receive direct current (DC) bias with a low pass filter.

Example 2 includes the subject matter of Example 1 and optionally further comprising a first signal filtering capacitive element at the common gate node and a second signal filtering capacitive element at the common body node.

Example 3 includes subject matter of any of Examples 1-2 and optionally further comprising a diode-connected MOSFET having a drain terminal and a gate terminal shorted together and coupled to the common body node, and the diode-connected MOSFET further including a source terminal coupled to ground.

Example 4 includes subject matter of any one of Examples 1-3 and optionally wherein the self-biased MOSFET is coupled to a signal port that does not directly connect to a die bump.

Example 5 includes the subject matter of any one of Examples 1-4 and optionally further comprising a shunt plurality of stacks, the shunt plurality of stacks having a first terminal coupled to the plurality of stacks and a second terminal coupled to ground.

Example 6 includes the subject matter of Example 5 and optionally further comprising a second plurality of stacks having a common gate node and a common body node, wherein the second plurality of stacks is coupled to the first terminal.

Example 7 includes the subject matter of Example 5 and optionally further comprising control circuitry to control the plurality of stacks and the shunt plurality of stacks.

Example 8 is an apparatus of a communication device, the apparatus comprising: an array of antenna elements; and front end circuitry coupled to the array of stacked antenna elements at a first node and coupled to transceiver circuitry at a second node, the front end circuitry comprising switch circuitry, the switch circuitry comprising: a plurality of stacks having a common gate node and a common body node, wherein a stack of the plurality of stacks includes a metal-oxide-semiconductor field-effect transistor (MOSFET) having a body resistive element coupled to a body terminal of the MOSFET and the common body node a gate resistive element coupled to a gate terminal of the MOSFET and the common gate node; and a self-biased MOSFET coupled to the common gate node and the common body node, a gate of the self-biased MOSFET configured to receive direct current (DC) bias with a low pass filter.

In Example 9, the subject matter of Example 8 can optionally include wherein the self-biased MOSFET is connected at a signal port not directly connected to an output bump.

In Example 10, the subject matter of any one of Examples 8-9 can optionally include wherein a DC bias of the first node is 0 volts and a DC bias of the second node is 0 volts.

In Example 11, the subject matter of any one of Examples 8-10 can optionally include wherein the switch circuitry further comprises a shunt plurality of stacks, the shunt plurality of stacks having a first terminal coupled to the plurality of stacks and a second terminal coupled to ground.

In Example 12, the subject matter of Example 11 can optionally include wherein the switch circuitry further comprises a second plurality of stacks having a common gate node and a common body node, wherein the second plurality of stacks is coupled to the first terminal.

In Example 13, the subject matter of Example 12 can optionally include further comprising control circuitry to control the plurality of stacks, the second plurality of stacks, and the shunt plurality of stacks.

In Example 14, the subject matter of any of Examples 11-13 can optionally include further comprising control circuitry to control the plurality of stacks and the shunt plurality of stacks.

In Example 15, the subject matter of any of Examples 8-14 can optionally include having an inductive element coupled at least at one of the first node and the second node and configured to match parasitic capacitance or apparatus capacitance.

Example 16 is a method to form a switch, the method comprising: providing a plurality of stacks having a common gate node and a common body node, wherein a stacks of the plurality of stacks includes a metal-oxide-semiconductor field-effect transistor (MOSFET) having a body resistive element coupled to a body terminal of the MOSFET and the common body node a gate resistive element coupled to a gate terminal of the MOSFET and the common gate node; and coupling a self-biased MOSFET to the common gate node and the common body node, a gate of the self-biased MOSFET configured to receive direct current (DC) bias with a low pass filter.

In Example 17, the subject matter of Example 16 can optionally include providing a first signal filtering capacitive element at the common gate node and a second signal filtering capacitive element at the common body node.

In Example 18, the subject matter of any of Examples 16-17 can optionally include providing a diode-connected MOSFET having a drain terminal and a gate terminal shorted together and coupled to the common body node, and the diode-connected MOSFET further including a source terminal coupled to ground.

In Example 19, the subject matter of any of Examples 16-18 can optionally include coupling the self-biased MOSFET to a signal port that does not directly connect to a die bump.

In Example 20, the subject matter of any of Examples 16-19 can optionally include providing a shunt plurality of stacks, the shunt plurality of stacks having a first terminal coupled to the plurality of stacks and a second terminal coupled to ground.

The above detailed description includes references to the accompanying drawings, which form a part of the detailed description. The drawings show, by way of illustration, specific aspects in which the invention can be practiced. These aspects are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other aspects can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description, with each claim standing on its own as a separate aspect, and it is contemplated that such aspects can be combined with each other in various combinations or permutations. The scope of the invention should be determined with reference to the appended claims, along with the full scope of equivalents to which such claims are legally entitled.

What is claimed is:

1. Switch circuitry comprising:

a plurality of stacks having a common gate node and a common body node, wherein a stack of the plurality of stacks includes a metal-oxide-semiconductor field-effect transistor (MOSFET) having a body resistive element coupled to a body terminal of the MOSFET and the common body node, and a gate resistive element coupled to a gate terminal of the MOSFET and the common gate node; and a self-biased MOSFET coupled to the common gate node and the common body node, a gate of the self-biased MOSFET configured to receive direct current (DC) bias with a low pass filter.

2. The switch circuitry of claim 1, further comprising a first signal filtering capacitive element at the common gate node and a second signal filtering capacitive element at the common body node.

3. The switch circuitry of claim 1, further comprising a diode-connected MOSFET having a drain terminal and a gate terminal shorted together and coupled to the common body node, and the diode-connected MOSFET further including a source terminal coupled to ground.

4. The switch circuitry of claim 1, wherein the self-biased MOSFET is coupled to a signal port that does not directly connect to a die bump.

5. The switch circuitry of claim 1, further comprising a shunt plurality of stacks, the shunt plurality of stacks having a first terminal coupled to the plurality of stacks and a second terminal coupled to ground.

6. The switch circuitry of claim 5, further comprising a second plurality of stacks having a common gate node and a common body node, wherein the second plurality of stacks is coupled to the first terminal.

7. The switch circuitry of claim 5, further comprising control circuitry to control the plurality of stacks and the shunt plurality of stacks.

8. A method to form a switch, the method comprising:

providing a plurality of stacks having a common gate node and a common body node, wherein a stacks of the plurality of stacks includes a metal-oxide-semiconductor field-effect transistor (MOSFET) having a body resistive element coupled to a body terminal of the MOSFET and the common body node, and a gate resistive element coupled to a gate terminal of the MOSFET and the common gate node; and coupling a self-biased MOSFET to the common gate node and the common body node, a gate of the self-biased MOSFET configured to receive direct current (DC) bias with a low pass filter.

9. The method of claim 8, further comprising providing a first signal filtering capacitive element at the common gate node and a second signal filtering capacitive element at the common body node.

10. The method of claim 8, further comprising providing a diode-connected MOSFET having a drain terminal and a gate terminal shorted together and coupled to the common body node, and the diode-connected MOSFET further including a source terminal coupled to ground.

11. The method of claim 8, further comprising coupling the self-biased MOSFET to a signal port that does not directly connect to a die bump.

12. The method of claim 8, further comprising providing a shunt plurality of stacks, the shunt plurality of stacks having a first terminal coupled to the plurality of stacks and a second terminal coupled to ground.

* * * * *